(12) United States Patent
Gomes et al.

(10) Patent No.: US 10,685,947 B2
(45) Date of Patent: Jun. 16, 2020

(54) DISTRIBUTED SEMICONDUCTOR DIE AND PACKAGE ARCHITECTURE

(71) Applicants: Wilfred Gomes, Portland, OR (US); Mark T. Bohr, Aloha, OR (US); Rajesh Kumar, Portland, OR (US); Robert L. Sankman, Phoenix, AZ (US); Ravindranath V. Mahajan, Chandler, AZ (US); Wesley D. Mc Cullough, Santa Clara, CA (US)

(72) Inventors: Wilfred Gomes, Portland, OR (US); Mark T. Bohr, Aloha, OR (US); Rajesh Kumar, Portland, OR (US); Robert L. Sankman, Phoenix, AZ (US); Ravindranath V. Mahajan, Chandler, AZ (US); Wesley D. Mc Cullough, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/869,637

(22) Filed: Jan. 12, 2018

(65) Prior Publication Data

US 2019/0221556 A1    Jul. 18, 2019

(51) Int. Cl.
*H01L 23/48* (2006.01)
*H01L 25/18* (2006.01)
(Continued)

(52) U.S. Cl.
CPC ............ *H01L 25/18* (2013.01); *H01L 23/481* (2013.01); *H01L 23/522* (2013.01);
(Continued)

(58) Field of Classification Search
CPC ......... H01L 25/18; H01L 24/09; H01L 24/17; H01L 23/481
See application file for complete search history.

(56) References Cited

U.S. PATENT DOCUMENTS 8,331,094 B2 * 12/2012 Ankireddi ............. H01L 23/367
165/185
9,065,722 B2 * 6/2015 Thottethodi ........ G06F 17/5068
(Continued)

OTHER PUBLICATIONS

Extended European Search Report received in European Patent Application No. 18211801.8, dated Apr. 8, 2019, 5 pages.

*Primary Examiner* — Hoa B Trinh
(74) *Attorney, Agent, or Firm* — Grossman, Tucker, Perreault & Pfleger, PLLC

(57) ABSTRACT

The present disclosure is directed to systems and methods of conductively coupling a plurality of relatively physically small core dies to a relatively physically larger base die using an electrical mesh network that is formed in whole or in part in, on, across, or about all or a portion of the base die. Electrical mesh networks beneficially permit the positioning of the cores in close proximity to support circuitry carried by the base die. The minimal separation between the core circuitry and the support circuitry advantageously improves communication bandwidth while reducing power consumption. Each of the cores may include functionally dedicated circuitry such as processor core circuitry, field programmable logic, memory, or graphics processing circuitry. The use of core dies beneficially and advantageously permits the use of a wide variety of cores, each having a common or similar interface to the electrical mesh network.

10 Claims, 11 Drawing Sheets

(51) Int. Cl.

| | |
|---|---|
| *H01L 25/00* | (2006.01) |
| *H01L 23/00* | (2006.01) |
| *H01L 23/538* | (2006.01) |
| *H01L 23/522* | (2006.01) |
| *H01L 25/16* | (2006.01) |
| *H01L 25/065* | (2006.01) |
| *H01L 23/498* | (2006.01) |

(52) U.S. Cl.
CPC .......... *H01L 23/5383* (2013.01); *H01L 24/09* (2013.01); *H01L 24/17* (2013.01); *H01L 25/0652* (2013.01); *H01L 25/16* (2013.01); *H01L 25/50* (2013.01); *H01L 23/49816* (2013.01); *H01L 2924/1432* (2013.01)

(56) References Cited

U.S. PATENT DOCUMENTS

| | | | |
|---|---|---|---|
| 2004/0145058 A1* | 7/2004 | Marty | H01L 21/6835 |
| | | | 257/758 |
| 2007/0285179 A1* | 12/2007 | Ikeda | H03B 5/1841 |
| | | | 331/56 |
| 2011/0001249 A1 | 1/2011 | Law et al. | |
| 2012/0188708 A1 | 7/2012 | Ankireddi et al. | |
| 2014/0177626 A1 | 6/2014 | Thottethodi et al. | |
| 2015/0109232 A1* | 4/2015 | Simmons | G06F 3/0488 |
| | | | 345/174 |
| 2017/0084077 A1* | 3/2017 | Liu | G06T 17/05 |
| 2018/0045580 A1* | 2/2018 | Merrikh | G01K 7/021 |

\* cited by examiner

DISTRIBUTED SEMICONDUCTOR DIE AND PACKAGE ARCHITECTURE

TECHNICAL FIELD

The present disclosure relates to semiconductor packaging and die architecture.

BACKGROUND

Next-generation Compute Devices, Programmable Logic (FPGA), Graphics units, (also called Compute Devices) and data centers are trending toward systems providing greater computational capabilities, operational flexibility, and improved power efficiency. The combination of demands presented by next-generation data centers and Compute devices present significant challenges for current general-purpose servers. Increasing demand for reduced system complexity, business agility and scalability has increased demand for virtualized data center infrastructure that will place additional demands on next-generation data servers. To meet such varied requirements, next-generation servers may be designed to address a specific workload matrix. However, such task- or service-oriented design, while improving power efficiency, compromises the long term flexibility of such next-generation servers. Thus, the servers used in next-generation data centers must be capable of providing a cost effective solution that addresses current and future computational demands, provide a flexible platform capable of meeting evolving operational needs, while delivering improved power efficiency over legacy servers.

The challenges presented by the growing ubiquity of Internet-of-Things (IoT) devices are surprisingly similar to those presented by next-generation data centers. With literally billions of connected devices, cloud-based infrastructure must quickly evaluate high-bandwidth data streams and determine which data may be processed and which data may be safely dropped.

Next-generation platforms share several distinct requirements: increased bandwidth; increased flexibility to promote increased functionality; improved power efficiency (or reduced power consumption) and reduced footprint requirements. Heretofore, designers may address such varied demands by packing additional components on a standard printed circuit board. The limitations inherent in such single board solutions may not satisfactorily address the multiple demands placed on next-generation devices. Such limitations include: chip-to-chip bandwidth limitations based on interconnect density; the power demand of long distance traces between chips; and the increased physical size of printed circuit boards to accommodate the chips. Monolithic integration of system components provides a potential solution, however such integration does not readily permit the integration of system components, each of which may evolve at different rates. For example, a logic chip built using a newer technology may not easily integrate or lend itself to monolithic fabrication with a memory chip built using an older technology.

Conventional solutions are therefore unable to meet future demands of higher bandwidth, greater power efficiency, increased functionality, and increased operational flexibility—all in a physically smaller package and die architecture.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
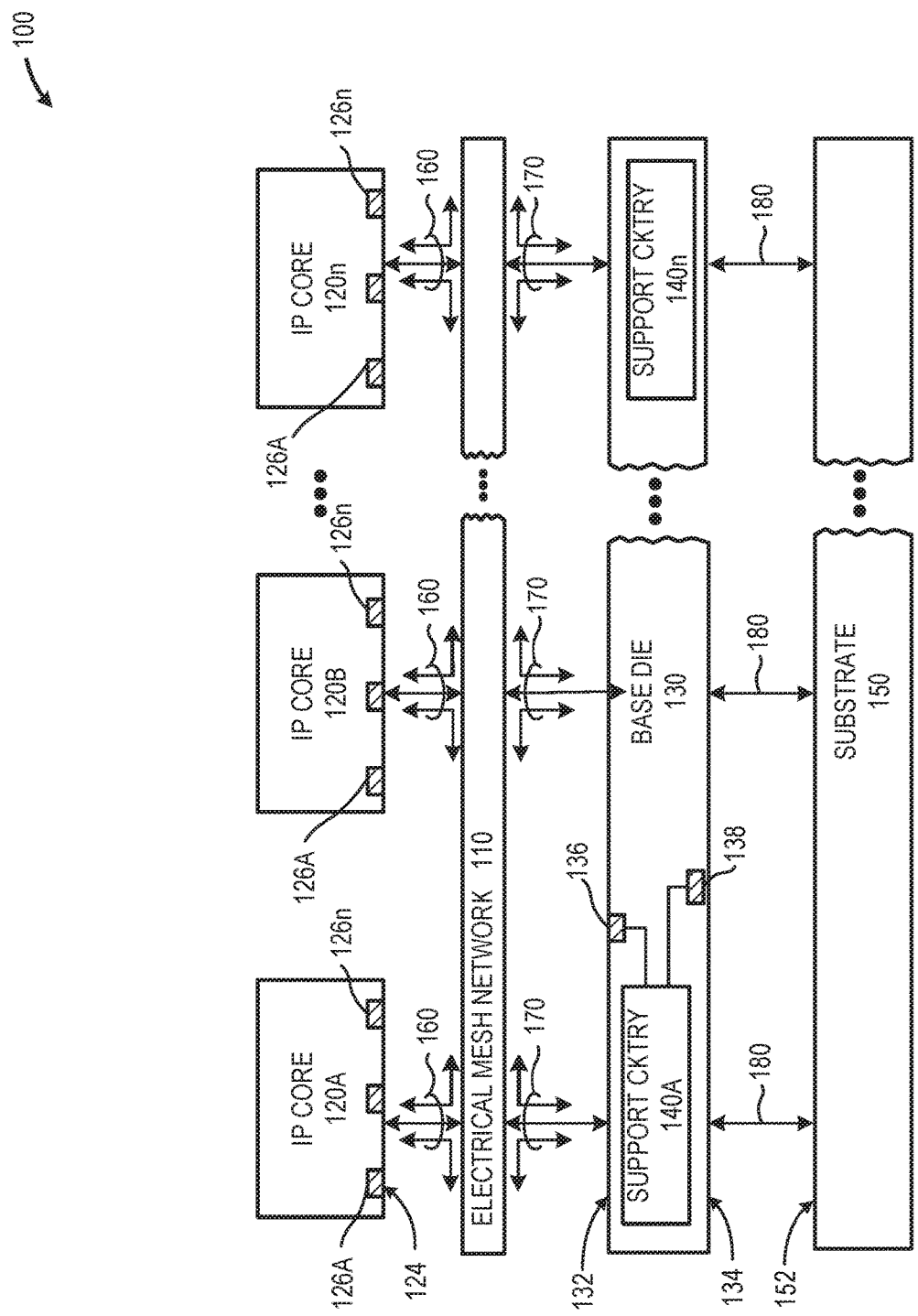
FIG. 1 is a schematic of an illustrative semiconductor package and die architecture that includes an electrical mesh network conductively coupled to each of a plurality of semiconductor intellectual property cores ("IP cores") and conductively coupled to a base die that includes a plurality of support circuits, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein include an electrical mesh network that couples a plurality of semiconductor intellectual property cores (hereinafter, "IP core" or collectively, "IP cores") to a single base die that includes circuitry to support the collective operation of the IP cores ("support circuitry"). For example, the base die may include data storage circuitry, voltage regulation circuitry, and/or input/output (I/O) circuitry conductively coupled, via the electrical mesh network, to a plurality of IP cores disposed across the upper surface of the base die. Such an arrangement beneficially and advantageously permits the selection of IP cores or a mixture of IP cores that address a particular need or functionality while still retaining a "standard" or "generic" base die configuration. Example IP cores may include, but are not limited to, semiconductor dies having: processor core circuitry, graphics processing circuitry, field programmable gate array circuitry, neural network circuitry, quantum computing circuitry, and similar.

The use of an electrical mesh network to conductively couple the IP cores to the base die beneficially reduces the physical separation between components, thereby improving bandwidth while reducing transmission power losses. Further, such an architecture provides flexibility to accommodate relatively rapid evolution in IP core technology by simply attaching the newly developed IP cores to a base die that may evolve at a much slower rate. Thus, evolutionary changes in IP core technology are readily combined with the base die, without requiring a full semiconductor package redesign as would be needed if the IP core circuitry and the support circuitry found on the base die were formed monolithically. For example, patterning an orthogonal electrical mesh network on an upper surface of the base die may form a plurality of "nodes" where the individual conductors forming the electrical mesh network intersect—IP cores may be conductively coupled to each of some or all of the nodes included in the plurality of nodes. In addition, they failure rate for semiconductor dies increases with the number of components, circuits, and systems incorporated in the die (i.e., failure rate typically increases with the size and/or complexity of the semiconductor die). Reducing the component count on the IP cores beneficially reduces both: the physical size of the die and the failure rate.

Where traditional solutions positioned dies on a two-dimensional circuit board, the systems and methods described herein stack the dies in a three-dimensional space, reducing the footprint, improving communication speed, and reducing power consumption. More specifically, the systems and methods disclosed herein dispose each IP core circuit on a relatively small semiconductor die. The plurality of IP core dies may be physically, conductively and communicably coupled to a relatively large base die that provides the collective support circuitry used by the plurality of conductively coupled IP core circuits. Example support circuitry may include, but is not limited to, voltage regulation circuitry, input/output circuitry, data storage circuitry, etc.

A semiconductor package and die architecture is provided. The semiconductor package and die or multiple dies may include: a base die having an upper surface and a lower surface, the base die including input/output circuitry; an electrical mesh network disposed proximate the upper surface of the base die and conductively coupled to the input/output circuitry included in the base die, the electrical mesh network including: a first plurality of conductors wherein; each of the first plurality of conductors disposed proximate the upper surface of the base die and spaced apart from the remaining first plurality of conductors; and a second plurality of conductors, wherein: each of the second plurality of conductors disposed proximate the upper surface of the base die and spaced apart from the remaining second plurality of conductors; and each of the second plurality of conductors intersects and conductively couples to at least one of the first plurality of conductors; a plurality of IP cores, each of the plurality of IP cores including processor core circuitry, each of the IP cores conductively coupled to a node formed by an intersection of one of the first plurality of conductors with one of the second plurality of conductors.

A semiconductor die and packaging method is provided. The method may include: forming a first plurality of conductors proximate an upper surface of a base die; forming a second plurality of conductors proximate the upper surface of the base die, wherein: each of the first plurality of conductors disposed proximate the upper surface of the base die and spaced apart from the remaining first plurality of conductors; each of the second plurality of conductors disposed proximate the upper surface of the base die and spaced apart from the remaining second plurality of conductors; and each of the first plurality of conductors intersects and conductively couples to at least one of the second plurality of conductors to form an electrical mesh network, the electrical mesh network conductively coupled to circuitry included in the base die; and conductively coupling each of a plurality of IP cores to a respective node formed by an intersection of one of the first plurality of conductors with one of the second plurality of conductors.

An electronic device is provided. The electronic device may include: a printed circuit board; and a semiconductor package conductively coupled to the printed circuit board, the semiconductor package including: a base die having an upper surface and a lower surface, the base die including input/output circuitry; an electrical mesh network disposed proximate the upper surface of the base die and conductively coupled to the circuitry included in the base die, the electrical mesh network including: a first plurality of conductors wherein; each of the first plurality of conductors disposed proximate the upper surface of the base die and spaced apart from the remaining first plurality of conductors; and a second plurality of conductors, wherein: each of the second plurality of conductors disposed proximate the upper surface of the base die and spaced apart from the remaining second plurality of conductors; and each of the second plurality of conductors intersects and conductively couples to at least one of the first plurality of conductors; a plurality of IP cores, each of the plurality of IP cores including processor core circuitry, each of the IP cores conductively coupled to a node formed by an intersection of one of the first plurality of conductors with one of the second plurality of conductors.

A semiconductor package system is provided. The semiconductor package system may include: means for forming a first plurality of conductors proximate an upper surface of a base die; means for forming a second plurality of conductors proximate the upper surface of the base die, where: each of the first plurality of conductors disposed proximate the upper surface of the base die and spaced apart from the remaining first plurality of conductors; each of the second plurality of conductors disposed proximate the upper surface of the base die and spaced apart from the remaining second plurality of conductors; and each of the first plurality of conductors intersects and conductively couples to at least one of the second plurality of conductors to form an electrical mesh network, the electrical mesh network conductively coupled to at least the I/O circuitry included in the base die; means for conductively coupling each of a plurality of IP cores to a node formed by an intersection of one of the first plurality of conductors with one of the second plurality of conductors.

A semiconductor package and die architecture is provided. The semiconductor package and die architecture may include: an electrical mesh network that includes: a first plurality of conductors; a second plurality of conductors, each of the second plurality of conductor intersecting at least one of the first plurality of conductors, forming a plurality of network nodes, each of the network nodes at an intersection of one of the first plurality of conductors with one of the second plurality of conductors; a base die including I/O circuitry conductively coupled to at least one of the plurality of nodes; and a plurality of IP cores, each of the plurality of IP cores including processor core circuitry; each of the plurality of IP cores conductively coupled to a respective one of the plurality of nodes.

As used herein the terms "top," "bottom," "upper," "lower," "lowermost," and "uppermost" when used in relationship to one or more elements are intended to convey a relative rather than absolute physical configuration. Thus, an element described as an "upper film layer" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 is a schematic of an illustrative semiconductor package 100 that includes an electrical mesh network 110 conductively coupled 160 to each of a plurality of semiconductor intellectual property cores 120A-120n (singly, "IP core 120" collectively, "IP cores 120") and conductively coupled 170 to a base die 130 that includes a plurality of support circuits 140A-140n (collectively, "support circuitry 140"), in accordance with at least one embodiment described herein. The base die 130 may communicably couple 180 to a substrate 150, such as a multi-layer printed circuit board or similar. In embodiments, the electrical mesh network 110 includes a number of interconnected conductive pathways or members that couple each of the IP cores 120 to one or more neighboring IP cores 120, facilitating communication between the IP cores 120. In embodiments the interconnected conductive pathways or members forming the electrical mesh network 110 also conductively couple each of the IP cores 120 to the base die 130 facilitating communication between the IP cores 120 and the support circuitry 140. The base die 130 provides a "resource pool" shared by some or all of the IP cores 120. Beneficially, as new IP core technology is introduced, IP cores 120 may be substituted in the manufacturing process without requiring a redesign of the base die 130—reducing manufacturing costs and improving manufacturing flexibility and market responsiveness.

The electrical mesh network 110 includes a first plurality of conductors and a second plurality of conductors disposed at an angle to the first plurality of conductors such that at least one of the second plurality of conductors intersects at least one of the first plurality of conductors. In some embodiments, the electrical mesh network 110 may include a first plurality of conductors disposed parallel to each other across all or a portion of the upper surface 132 of the base die 130 and a second plurality of conductors disposed parallel to each other and orthogonal to each of the first plurality of conductors. Each intersection point where one of the second plurality of conductors contacts one of the first plurality of conductors defines one of a plurality of nodes on the electrical mesh network 110. In embodiments, each of the IP cores 120 may be conductively coupled to a respective electrical mesh network node. In embodiments, the electrical mesh network 110 may be deposited, patterned, formed, or otherwise disposed on, across, or about at least a portion of the upper surface 132 of the base die 130 using any currently available or future developed material deposition process or method. In some implementations, the electrical mesh network 110 may be formed on a single layer across all or a portion of the base die 130—i.e., the first plurality of conductors and the second plurality of conductors may be formed on the same layer (e.g., the same metal layer) of the base die 130. In some implementations, the electrical mesh network 110 may be formed in multiple layers across all or a portion of the base die 130—i.e., each of the first plurality of conductors and/or each of the second plurality of conductors may be formed on two or more different layers (e.g., adjacent or non-adjacent metal layers) of the base die 130.

Each of the semiconductor intellectual property cores ("IP cores") 120 may include, but is not limited to, a reusable unit of logic, cell, or integrated circuit/chip/chiplet layout design. Example IP cores 120 include, but are not limited to, universal asynchronous receiver/transmitter (UARTs); central processing units (CPUs); graphics processing units (GPUs); IEEE 802.11 Ethernet controllers; Peripheral Component Interconnect (PCI) interfaces; storage devices; and similar. Each of the IP cores 120 includes circuitry (e.g., processor core circuitry) disposed on a relatively small (compared to the base die 130) integrated circuit. Each of the IP cores 120 has a lower surface 124 that is disposed proximate the electrical mesh network 110. In embodiments, the machine executable instruction sets that cause the operation of the support circuitry 140 in the base die 130 may be executed in whole or in part by processor circuitry and/or controller circuitry disposed in, on, or about the IP cores 120. In embodiments, each of the IP cores 120 may occupy the same area on the upper surface 132 of the base die 130. In embodiments, the IP cores 120 may occupy different areas on the upper surface 132 of the base die 130. In embodiments, the IP cores 120 may have a surface area of less than: about 25 square millimeters (mm²); about 20 mm²; about 15 mm²; about 12 mm²; about 10 mm²; about 8 mm²; or about 5 mm².

Each of the IP cores 120 includes one or more conductive fixtures 126A-126n (contact bumps, pads, lands, grooves, pins, etc.—collectively "conductive fixtures 126") disposed in, on, about, or across at least a portion of the lower surface 124 of the IP core 120. The one or more conductive fixtures 126 may be disposed in a fixed pattern or arrangement in, on, about or across the lower surface 124 of each of the IP cores 120 conductively coupled to the base die 130.

Maintaining the conductive features 126 in a fixed pattern or arrangement beneficially permits the replacement and/or substitution of IP cores 120 without requiring a redesign of the base die 130. For example, a newer IP core $120_{NEW}$ may selectively replace an older IP core $120_{OLD}$ in a particular semiconductor package design. Such replacement is greatly facilitated and redesign time and costs reduced or even eliminated when the arrangement of the conductive features 126 on the older IP core $120_{OLD}$ match the arrangement of the conductive features found on the newer IP core $120_{NEW}$. Since IP cores 120 may be readily substituted without requiring a complete rework of the base die 130, time-to-market is advantageously reduced and market responsiveness beneficially improved.

At least one of the one or more conductive fixtures 126 may conductively couple 160 the respective IP core 120 to the electrical mesh network 110. In embodiments, at least one of the one or more conductive fixtures 126 may conductively couple 160 the IP core 120 to support circuitry 140 disposed in the base die 130. In embodiments, an electrically conductive micro solder bumps, solder balls, solder paste, or similar material may physically and/or electrically conductively couple 160 the IP cores 120 to the electrical mesh network 110 and/or support circuitry in the base die 130.

The base die 130 includes support circuitry 140 that is deposited, patterned, formed, or otherwise disposed in, on, or about the base die 130. In embodiments, the support circuitry 140 may include, but is not limited to, one or more of the following: data storage circuitry; cache circuitry; input/output circuitry; processor voltage regulation circuitry (e.g., fully integrated voltage regulator or "FIVR" circuitry); communications interface circuitry; bus interface circuitry; and combinations thereof. The base die 130 may provide the substrate for the semiconductor package 100. In embodiments, the base die 130 is relatively larger than each of the IP cores 120. In embodiments, the base die may have an upper surface area of less than: about 3000 square millimeters (mm²); about 2500 mm²; about 2000 mm²; about 1500 mm²; about 1000 mm²; about 700 mm²; or about 500 mm². In embodiments, all or a portion of the peripheral regions of the base die 130 may include I/O circuitry. In embodiments, all or a portion of the central region of the base die 130 bounded by the peripheral regions may include cache memory circuitry. In such embodiments, the IP cores 120 may be coupled to the electrical mesh network 110 and/or base die 130 in the central region of the base die 130 that include the cache memory circuitry. Disposing the IP cores 120 proximate the cache memory circuitry in the base die beneficially reduces cache access time, thereby improving the performance of the semiconductor package 100.

At least a portion of the electrical mesh network 110 may be disposed, patterned, deposited, or otherwise formed in, on, about, or across at least a portion of the upper surface 132 of the base die 130. In embodiments, the electrical mesh network 110 may be formed as a single metal layer on the upper surface 132 of the base die 130. In other embodiments, the electrical mesh network 110 may be formed as a plurality of metal layers on the upper surface 132 of the base die 130. The electrical mesh network 110 may be formed using any currently available or future developed material deposition and/or patterning process or method. Non-limiting examples of material deposition and/or patterning processes include, but are not limited to, photolithography, printing, electro-plating, electro-less plating, chemical vapor deposition, atomic layer deposition, physical layer deposition, and similar. The support circuitry 140 disposed in the base die 130 communicably couples 170 to the electrical mesh network 110 using conductors such as metal traces, vias, and similar that are disposed in, on, or about the base die 130.

In addition to conductively coupling to the electrical mesh network 110, at least some of the IP cores 120 may conductively couple to the support circuitry 140 disposed in the base die 130. In embodiments, one or more conductive structures 136 may be deposited, patterned, formed, or otherwise disposed in, on, about, or across all or a portion of the upper surface 132 of the base die 130 to couple at least one IP core 120 to the support circuitry 140 carried by the base die 130. Conductors, such as metal traces, vias, etc., couple the conductive structures 136 on the upper surface 132 of the base die 130 to the support circuitry 140.

A plurality of conductive features 138 may be deposited, patterned, formed, or otherwise disposed in, on, about, or across at least a portion of the lower surface 134 of the base die 130. The plurality of conductive features 138 conductively couple 180 the base die 130 (and the semiconductor package 100) to a substrate 150, such as a printed circuit board, motherboard, daughterboard, server blade, or similar. Conductors, such as metal traces, vias, etc., conductively couple the conductive features 138 on the lower surface 132 of the base die 130 to the support circuitry 140 and/or the electrical mesh network 110.

Figure 2:
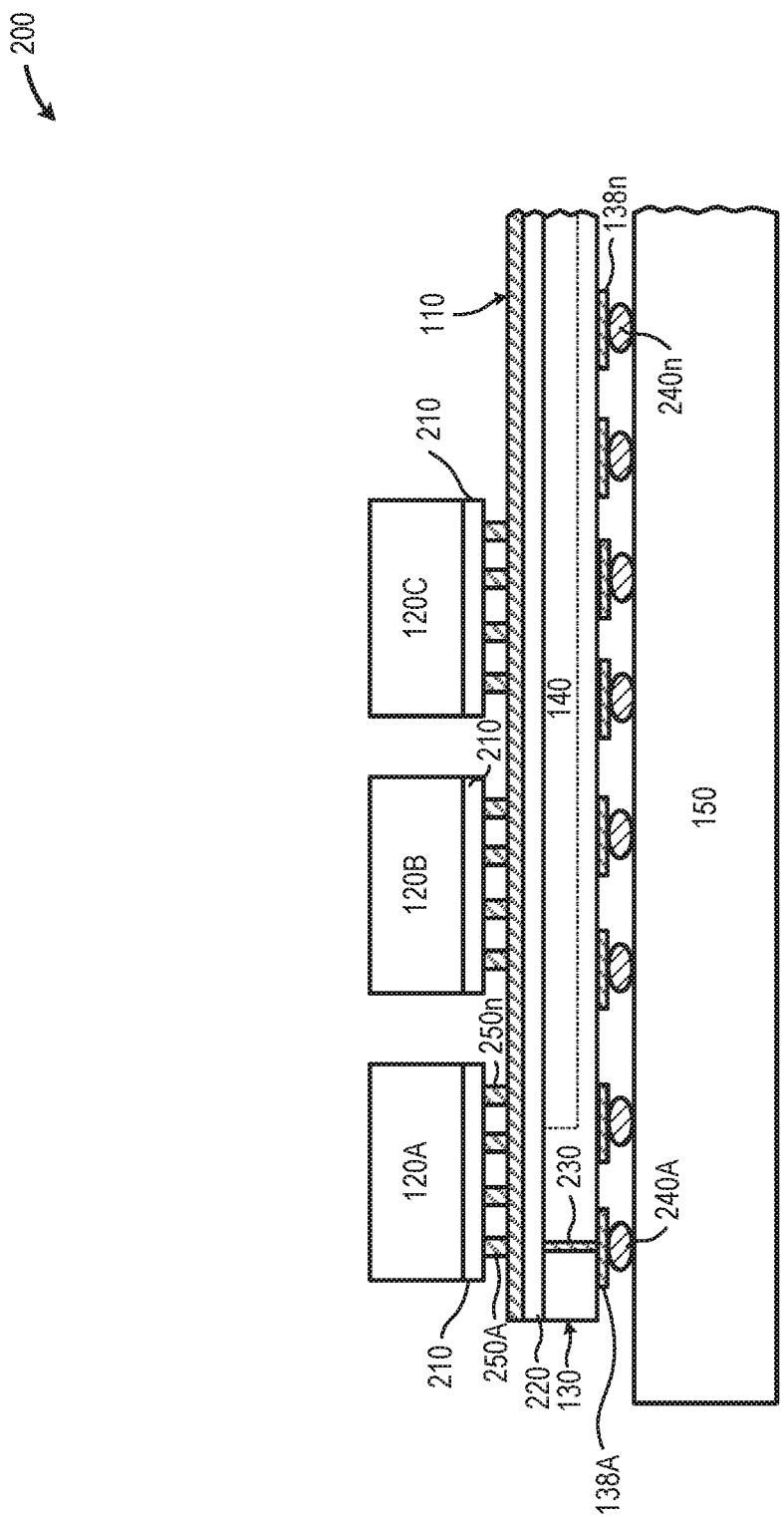
FIG. 2 is a partial cross-sectional elevation of an illustrative semiconductor package and die architecture that includes an electrical mesh network communicably coupling a plurality of IP cores to a base die, in accordance with at least one embodiment described herein.

FIG. 2 is a partial cross-sectional elevation of an illustrative semiconductor package 200 that includes an electrical mesh network 110 communicably coupling a plurality of IP cores 120A-120C to a base die 130, in accordance with at least one embodiment described herein. As depicted in FIG. 2, semiconductor components, including active semiconductor components such as transistors, may be formed or otherwise disposed in a lower portion 210 of each of the respective IP cores 120. Disposing semiconductor components in the lower portion 210 of each of the IP cores 120 reduces the physical separation between the circuitry containing the respective semiconductor components and the electrical mesh network 110, beneficially improving performance while reducing power losses. Similarly, semiconductor components, including active semiconductor components such as transistors, may be formed or otherwise disposed in an upper portion 220 of the base die 130. In at least some embodiments, at least some of the semiconductor components disposed in the upper portion 220 of the base die 130 may form all or a portion of the support circuitry 140. In such embodiments, disposing semiconductor components in the upper portion 220 of the base die 130 reduces the physical separation between the support circuitry 140 and the electrical mesh network 110, further improving performance while reducing power losses.

One or more conductors 230, such as one or more vias or traces, may conductively couple at least a portion of the semiconductor components formed or disposed in the upper portion 220 of the base die 130 to one or more of the plurality of conductive features 138 (pads, lands, contacts, grooves, pins, etc.) deposited, formed, patterned, or otherwise disposed in, on, about, or across the lower surface of the base die 130. Conductive structures 240A-240n, such as solder bumps, solder balls, clips, and/or pins, may be used to physically and conductively couple the base die 130 to the substrate 150.

One or more conductive structures 250A-250n (collectively, "conductive structures 250"), such as one or more micro-bumps, solder bumps, solder balls, or similar conductively couple each of the IP cores 120 to the electrical mesh network 110 and/or the base die 130. In embodiments, the one or more conductive structures may include a plurality of micro-bumps arranged on a fine pitch array. For example, the conductive structures 250 may include micro-bumps formed from copper (Cu), copper containing alloys, silver (Ag), silver containing alloys, nickel (Ni), nickel containing alloys, and combinations thereof. In embodiments, the conductive structures 250 may include micro-bumps having a diameter of less than: about 50 micrometers (am); about 40 μm; about 30 μm; about 25 μm; about 15 μm; or about 10 μm. In embodiments, the conductive structures 250 may disposed on a pitch of less than: about 70 micrometers (am); about 60 μm; about 50 μm; about 40 μm; about 30 μm, or about 20 μm. In some implementations, a fine layer of solder similar electrically conductive material capable of reflow may be disposed proximate the conductive fixtures 126 disposed on the lower surface 124 of the IP cores 120.

Figure 3A:
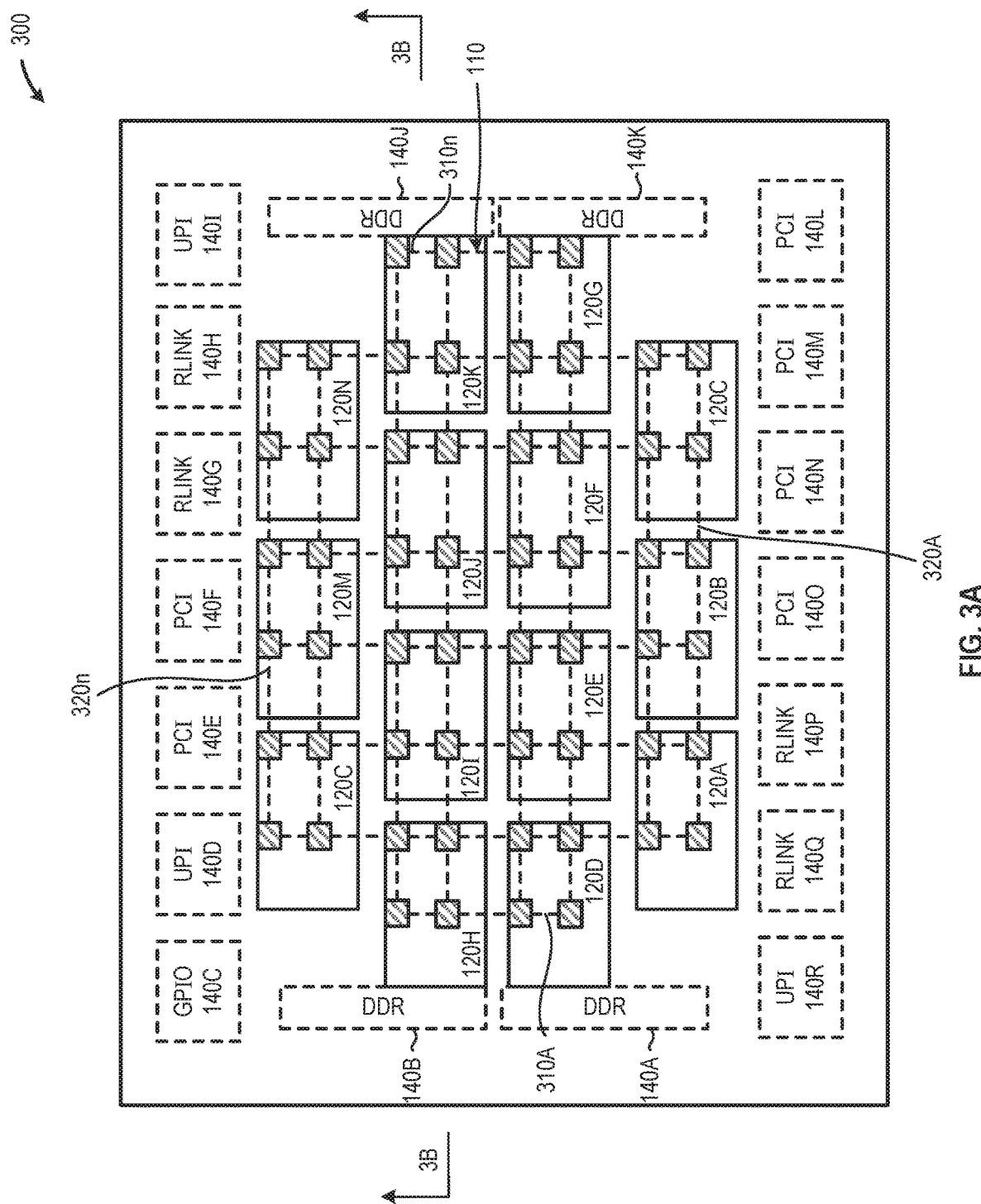
FIG. 3A is a plan view of an illustrative semiconductor package and die architecture that includes an electrical mesh network that includes a first plurality of conductors and a second plurality of conductors disposed orthogonally to the first conductors, in accordance with at least one embodiment described herein.
Figure 3B:
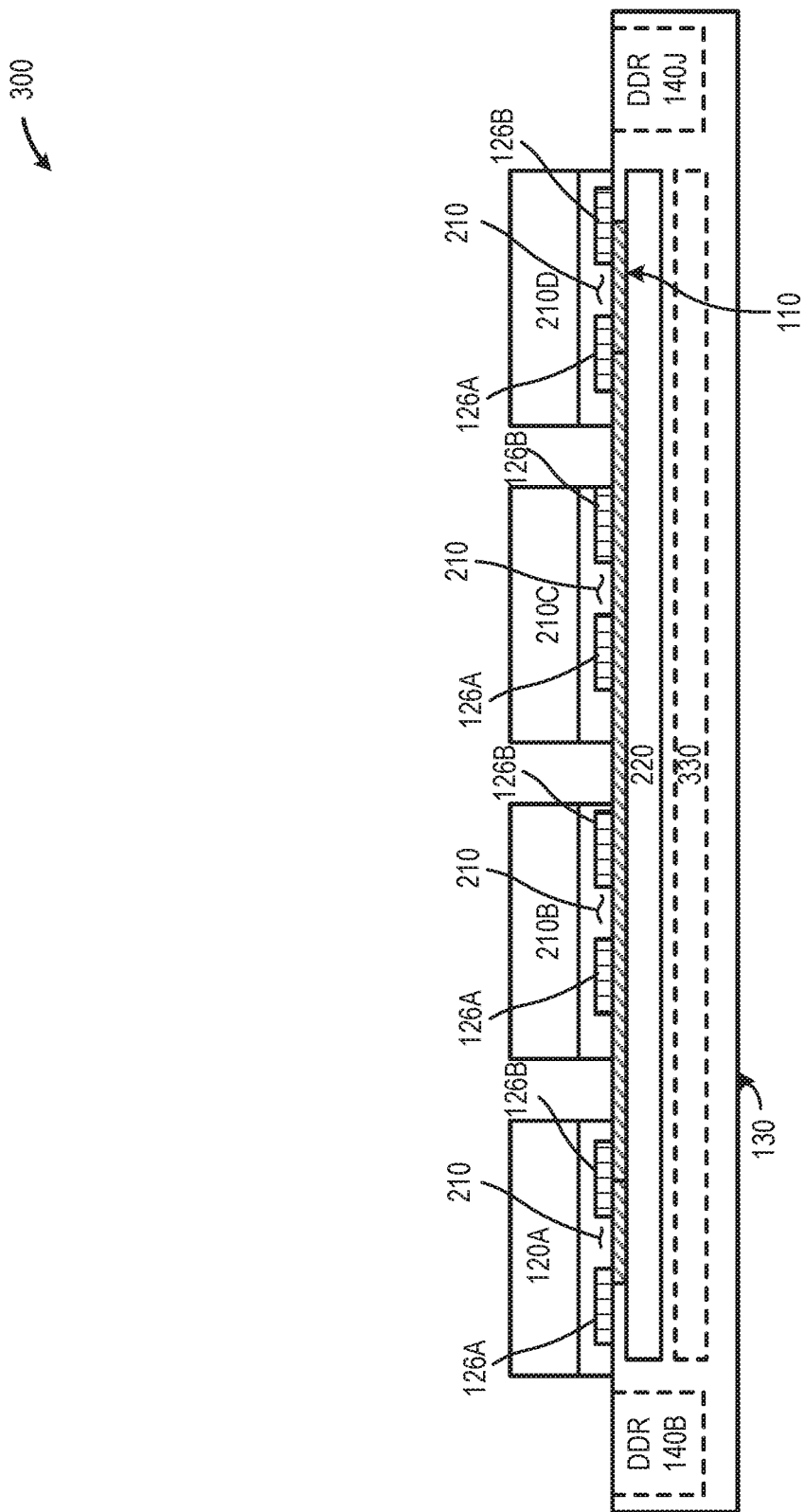
FIG. 3B is a cross-sectional elevation of the illustrative semiconductor package and die architecture depicted in FIG. 3A along section line 3B-3B, in accordance with at least one embodiment described herein.

FIG. 3A is a plan view of an illustrative semiconductor package 300 that includes an electrical mesh network 110 that includes a first plurality of conductors 310A-310n (collectively "first conductors 310") and a second plurality of conductors 320A-320n (collectively, "second conductors 320") disposed orthogonally to the first conductors 310, in accordance with at least one embodiment described herein. FIG. 3B is a cross-sectional elevation of the illustrative semiconductor package depicted in FIG. 3A along section line 3B-3B, in accordance with at least one embodiment described herein. As depicted in FIGS. 3A and 3B, the electrical mesh network 110 conductively and physically couples a plurality of IP cores 120A-120n to a base die 130 that includes a plurality of support circuitry 140A-140n.

Each of the IP cores 120 may include any number of circuits or circuitry. As depicted in FIG. 3A, each of the IP cores 120A-120n include four processor core circuits 330A-330D (collectively, "processor core circuits 330"). Each of the processor core circuits 330 is conductively coupled to the electrical mesh network 110. The electrical mesh network 110 conductively couples each of the IP cores 120 to at least a portion of the remaining IP cores. The electrical mesh network 110 also conductively couples each of the IP cores 120 to the support circuitry 140 disposed in the base die 130.

The base die 130 includes a plurality of support circuits 140. In embodiments, the base die 130 may include a region containing cache storage circuits 330. In such embodiments, the IP cores 120 may be positioned proximate the region of the base die 130 that includes the cache storage circuits 330. Positioning the IP cores 120 proximate the cache storage circuits beneficially improves cache access times while reducing power consumption.

A number of support circuits 140, including input/output (I/O) circuits may be deposited, formed, patterned, or otherwise disposed in, on, across, or about the periphery of the base die 130. The I/O circuits may include any currently available or future developed I/O circuits 140. Example I/O circuits may include, but are not limited to, serial I/O interfaces, parallel I/O interfaces; wired I/O interfaces; wireless I/O interfaces; or combinations thereof. In the example semiconductor package 300 depicted in FIGS. 3A and 3B, the I/O circuits include general purpose I/O (GPIO) circuitry 140C; ultra-path interconnect (UPI) circuitry 140D, 140R; peripheral component interconnect (PCI) circuitry 140E, 140F, 140L, 140M, 140N, 140O; and RLink circuitry 140G, 140H, 140P, 140Q.

An additional number of support circuits 140, including data storage circuits may be deposited, formed, patterned, or otherwise disposed in, on, across, or about the periphery of the base die 130. The data storage circuits may include any currently available or future developed data storage technology. Such data storage circuits may include, but are not limited to, electrostatic data storage circuits; quantum data storage circuits; molecular data storage circuits; electroresistive data storage circuits; optical data storage circuits; or combinations thereof. In the example semiconductor package 300 depicted in FIGS. 3A and 3B, the base die 130 includes dual data rate (DDR) I/O circuitry 140A, 140B, 140J, and 140K.

The first plurality of conductors 310 includes conductors 310A-310n deposited, formed, patterned, or otherwise disposed in, on, about, or across the upper surface 132 of the base die 130. In embodiments, the conductors 310A-310n included in the first plurality of conductors 310 may be disposed on the same or different metal layers disposed in, on, or about the base die 130. In embodiments, each of the conductors 310A-310n included in the first plurality of conductors 310 may be deposited, formed, patterned, or otherwise disposed in a regular or irregular pattern on the upper surface 132 of the base die 130. Although depicted in FIG. 3A as deposited in a straight line, each of the conductors 310A-310n included in the plurality of conductors 310 may have any configuration that includes, but is not limited to, having: any shape, any dimensions (length, height, width, etc.), and/or or any physical configuration (curved, sinusoidal, elliptical, circular, polygonal, etc.).

In embodiments, the spacing or physical distance between each of the conductors 310A-310n included in the first plurality of conductors 310 may be the same or different. In embodiments, the spacing between any two of the conductors 310A-310n included in the first plurality of conductors 310 may be constant or variable. In embodiments, the conductors 310A-310n included in the first plurality of conductors 310 may be disposed parallel to each other and with a constant or variable separation distance between adjacent conductors. The conductors 310A-310n included in the first plurality of conductors 310 may be composed of a metallic or non-metallic, electrically conductive, material. Example metallic materials include, but are not limited to, copper, copper containing alloys, aluminum, aluminum containing alloys, and similar. Example non-metallic materials include conductive polymers and conductive nanoparticles (e.g., silver nanowires) suspended in a polymer matrix.

The second plurality of conductors 320 includes conductors 320A-320n deposited, formed, patterned, or otherwise disposed in, on, about, or across the upper surface 132 of the base die 130. In embodiments, the conductors 320A-320n included in the second plurality of conductors 320 may be disposed on the same or different layers included in the base die 130. In embodiments, some or all of the conductors 320A-320n included in the second plurality of conductors 320 may be disposed on the same or different layers than some or all of the conductors 310A-310n included in the first plurality of conductors 310. Although depicted in FIG. 3A as deposited in a straight line, each of the conductors 320A-320n included in the second plurality of conductors 320 may have any configuration that includes, but is not limited to, having: any shape, any dimensions (length, height, width, etc.), and/or or any physical configuration (curved, sinusoidal, elliptical, circular, polygonal, etc.).

In embodiments, at least one of the conductors 320A-320n included in the second plurality of conductors 320 intersects at least one of the conductors 310A-310n included in the first plurality of conductors 310 to form the electrical mesh network 110. In other embodiments, at least one of the conductors 320A-320n included in the second plurality of conductors 320 intersects each of the conductors 310A-310n included in the first plurality of conductors 310 to form the electrical mesh network 110. In yet other embodiments, each of the conductors 320A-320n included in the second plurality of conductors 320 intersects each of the conductors 310A-310n included in the first plurality of conductors 310 to form the electrical mesh network 110.

Each of the conductors 320A-320n included in the second plurality of conductors 320 may be disposed at any angle measured with respect to the conductors 310A-310n included in the first plurality of conductors 310. In embodiments, at least one of the conductors 320A-320n included in the second plurality of conductors 320 may be disposed orthogonal to at least one of the conductors 310A-310n included in the first plurality of conductors 310. In embodiments, each of the conductors 320A-320n included in the second plurality of conductors 320 may be disposed orthogonal to each of the conductors 310A-310n included in the first plurality of conductors 310.

The electrical mesh network 110 formed by the conductors 310A-310n included in the first plurality of conductors 310 and the conductors 320A-320n included in the second plurality of conductors 320 form an electrical mesh network 110 that includes plurality of nodes. The intersection and/or electrical coupling of a conductive member 310 with a conductive member 320 forms a "node" on the electrical mesh network 110. Where the conductor 310 and the conductor 320 are formed or disposed on the same layer in the base die 130, the node is the location where the conductors 310 and 320 intersect. Where conductor 310 and conductor 320 are formed disposed on different layers in the base die 130, the node occurs at the location where a via or similar conductive feature electrically couples conductor 310 with conductor 320.

In embodiments, each of the conductors 320A-320n included in the second plurality of conductors 320 may be deposited, formed, patterned, or otherwise disposed in a regular or irregular pattern on the upper surface 132 of the base die 130. In embodiments, the spacing between each of the conductors 320A-320n included in the second plurality of conductors 320 may be the same or different. In embodiments, the spacing between any two of the conductors 320A-320n included in the second plurality of conductors 320 may be constant or variable. In embodiments, the conductors 320A-320n included in the second plurality of conductors 320 may be disposed parallel to each other and with a constant or variable separation distance between adjacent conductors. The conductors 320A-320n included in the second plurality of conductors 320 may be composed of a metallic or non-metallic, electrically conductive, material. Example metallic materials include, but are not limited to, copper, copper containing alloys, aluminum, aluminum containing alloys, and similar. Example non-metallic materials include conductive polymers and conductive nanoparticles (e.g., silver nanowires) suspended in a polymer matrix.

The conductors 310A-310n included in the first plurality of conductors 310 and the conductors 320A-320n included in the second plurality of conductors 320 may be formed, patterned, deposited, and/or disposed in, on, across, or about the base die 130 using any currently available or future developed material deposition processes and/or methods. Example, non-limiting, material deposition processes include, but are not limited to: photolithography, printing, electroplating, electroless plating, thin film deposition, atomic layer deposition, and similar. In embodiments, all or a portion of the conductors 310A-310n included in the first plurality of conductors 310 and/or all or a portion of the conductors 320A-320n included in the second plurality of conductors 320 may be disposed at any layer and/or location across the thickness of the base die 130 such that all or a portion of the electrical mesh network 110 is formed internal to the base die 130. In other embodiments, all or a portion of the conductors 310A-310n included in the first plurality of conductors 310 and/or all or a portion of the conductors 320A-320n included in the second plurality of conductors 320 may be disposed in, on, about, or across at least a portion of the lower surface 134 of the base die 130 such that all or a portion of the electrical mesh network 110 is formed on at least a portion of the lower surface 134. In such embodiments one or more through silicon vias (TSVs) may conductively couple one or more IP cores 120 to the electrical mesh network 110. In yet other embodiments, all or a portion of the conductors 310A-310n included in the first plurality of conductors 310 and/or all or a portion of the conductors 320A-320n included in the second plurality of conductors 320 may be disposed in, on, about, or across at least a portion of the upper surface 132 of the base die 130 such that all or a portion of the electrical mesh network 110 is formed on at least a portion of the upper surface 132.

Figure 4:
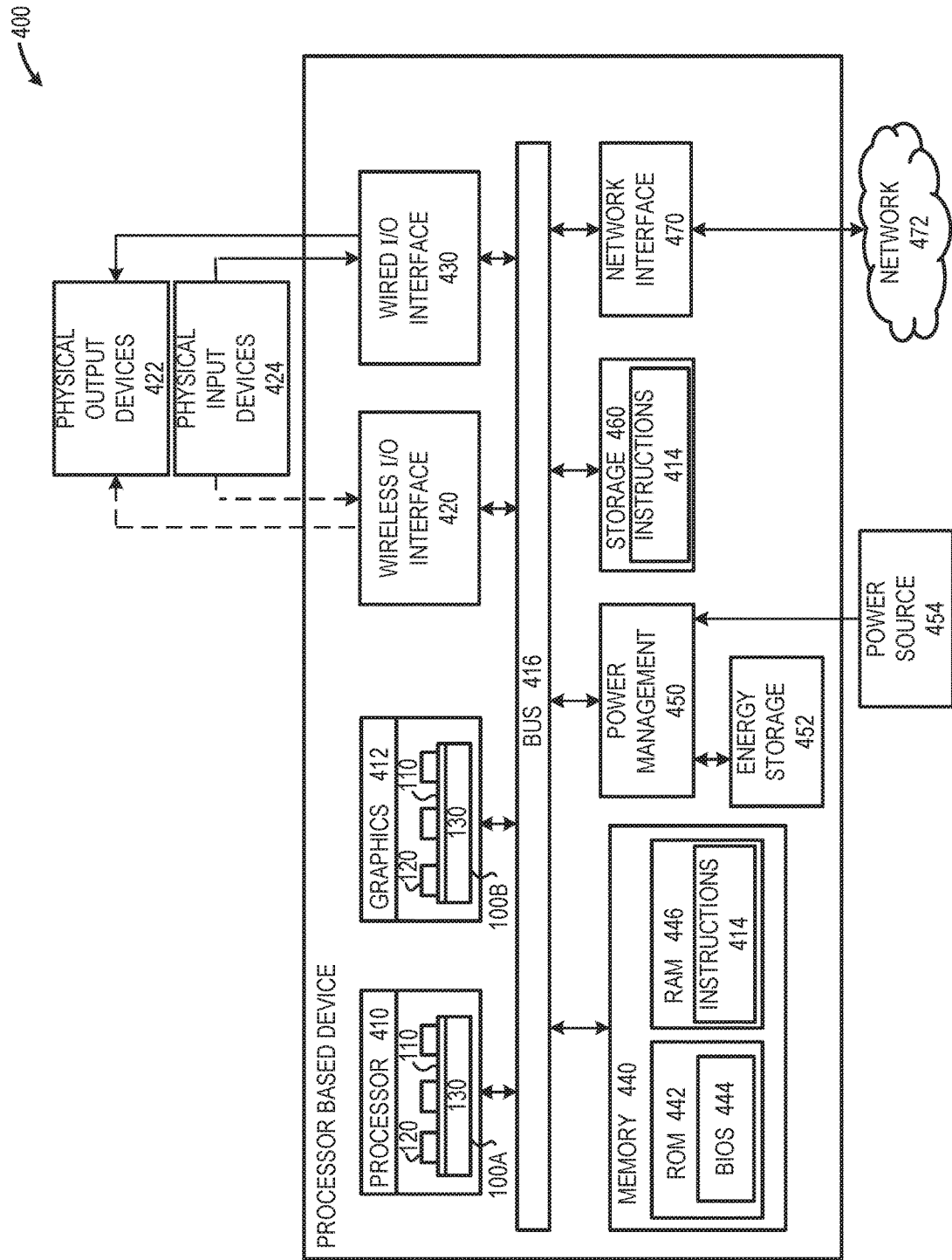
FIG. 4 is a schematic diagram of an illustrative processor-based device that includes one or more semiconductor packages and die architectures each having an electrical mesh network that conductively couples a plurality of IP cores to a base die as described in FIGS. 1-3, in accordance with at least one embodiment described herein.

FIG. 4 is a schematic diagram of an illustrative processor-based device 400 that includes one or more semiconductor packages 100A, 100B, each having an electrical mesh network 110 that conductively couples a plurality of IP cores 120 to a base die 130 as described in FIGS. 1-3, in accordance with at least one embodiment described herein. The processor-based device 400 may include one or more: processor circuits 410, graphics processor circuits 412, wireless input/output (I/O) interfaces 420, wired I/O interfaces 430, memory circuits 440, power management circuits 450, storage devices 460, and/or network interfaces 470. The following discussion provides a brief, general description of the components forming the illustrative processor-based device 400. Example, non-limiting processor-based devices 400 may include: smartphones, wearable computers, portable computing devices, handheld computing devices, desktop computing devices, blade server devices, workstations, and similar.

The processor-based device 400 includes processor circuitry 410 having an electrical mesh network 110 that conductively couples a plurality of IP cores 120 to a base die 130. In embodiments, the processor-based device 400 may additionally include graphics processor circuitry 412 having an electrical mesh network 110 that conductively couples a plurality of IP cores 120 to a base die 130. In embodiments, the processor-based device 400 includes one or more processor circuits 410 capable of executing machine-readable instruction sets 414, reading data and/or instructions 414 from one or more storage devices 460 and writing data to the one or more storage devices 460. In some embodiments, the processor-based device 400 includes one or more graphics processor circuits 412 capable of executing machine-readable instruction sets 414 and generating an output signal capable of providing a display output to a system user. Those skilled in the relevant art will appreciate that the illustrated embodiments as well as other embodiments may be practiced with other processor-based device configurations, including portable electronic or handheld electronic devices, for instance smartphones, portable computers, wearable computers, consumer electronics, personal computers ("PCs"), network PCs, minicomputers, server blades, mainframe computers, and the like.

The processor circuitry 410 may include any number of hardwired or configurable circuits, some or all of which may include programmable and/or configurable combinations of electronic components, semiconductor devices, and/or logic elements that are disposed partially or wholly in a PC, server, or other computing system capable of executing processor-readable instructions.

The processor-based device 400 includes a bus or similar communications link 416 that communicably couples and facilitates the exchange of information and/or data between various system components including the processor circuitry 410, the graphics processor circuitry 412, one or more wireless I/O interfaces 420, one or more wired I/O interfaces 430, one or more storage devices 460, and/or one or more network interfaces 470. The processor-based device 400 may be referred to in the singular herein, but this is not intended to limit the embodiments to a single processor-based device 400, since in certain embodiments, there may be more than one processor-based device 400 that incorporates, includes, or contains any number of communicably coupled, collocated, or remote networked circuits or devices.

The processor circuitry 410 may include one or more semiconductor packages 100A that include a electrical mesh network 110 coupled to a plurality of relatively small IP cores 120 and a single, relatively large, base die 130. The graphics processor circuitry 412 may include one or more semiconductor packages 100B that include a electrical mesh network 110 coupled to a plurality of relatively small IP cores 120 and a single, relatively large, base die 130.

The processor circuitry 410 may include any number, type, or combination of devices. The processor circuitry 410 may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), programmable logic units, field programmable gate arrays (FPGAs), and the like. Unless described otherwise, the construction and operation of the various blocks shown in FIG. 4 are of conventional design. Consequently, such blocks need not be described in further detail herein, as they will be understood by those skilled in the relevant art. The bus 416 that interconnects at least some of the components of the processor-based device 400 may employ any known serial or parallel bus structures or architectures.

The system memory 440 may include read-only memory ("ROM") 442 and random access memory ("RAM") 446. A portion of the ROM 442 may be used to store or otherwise retain a basic input/output system ("BIOS") 444. The BIOS 444 provides basic functionality to the processor-based device 400, for example by causing the processor circuitry 410 to load one or more machine-readable instruction sets 414. In embodiments, at least some of the one or more machine-readable instruction sets 414 cause at least a portion of the processor circuitry 410 to provide, create, produce, transition, and/or function as a dedicated, specific, and particular machine, for example a word processing machine, a digital image acquisition machine, a media playing machine, a gaming system, a communications device, or similar.

The processor-based device 400 may include at least one wireless input/output (I/O) interface 420. The at least one wireless I/O interface 420 may be communicably coupled to one or more physical output devices 422 (tactile devices, video displays, audio output devices, hardcopy output devices, etc.). The at least one wireless I/O interface 420 may communicably couple to one or more physical input devices 424 (pointing devices, touchscreens, keyboards, tactile devices, etc.). The at least one wireless I/O interface 420 may include any currently available or future developed wireless I/O interface. Example wireless I/O interfaces include, but are not limited to: BLUETOOTH®, near field communication (NFC), and similar.

The processor-based device 400 may include one or more wired input/output (I/O) interfaces 430. The at least one wired I/O interface 430 may be communicably coupled to one or more physical output devices 422 (tactile devices, video displays, audio output devices, hardcopy output devices, etc.). The at least one wired I/O interface 430 may be communicably coupled to one or more physical input devices 424 (pointing devices, touchscreens, keyboards, tactile devices, etc.). The wired I/O interface 430 may include any currently available or future developed I/O interface. Example wired I/O interfaces include, but are not limited to: universal serial bus (USB), IEEE 1394 ("FireWire"), and similar.

The processor-based device 400 may include one or more communicably coupled, non-transitory, data storage devices 460. The data storage devices 460 may include one or more hard disk drives (HDDs) and/or one or more solid-state storage devices (SSDs). The one or more data storage devices 460 may include any current or future developed storage appliances, network storage devices, and/or systems. Non-limiting examples of such data storage devices 460 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 460 may include one or more removable storage devices, such as one or more flash drives, flash memories, flash storage units, or similar appliances or devices capable of communicable coupling to and decoupling from the processor-based device 400.

The one or more data storage devices 460 may include interfaces or controllers (not shown) communicatively coupling the respective storage device or system to the bus 416. The one or more data storage devices 460 may store, retain, or otherwise contain machine-readable instruction sets, data structures, program modules, data stores, databases, logical structures, and/or other data useful to the processor circuitry 410 and/or graphics processor circuitry 412 and/or one or more applications executed on or by the processor circuitry 410 and/or graphics processor circuitry 412. In some instances, one or more data storage devices 460 may be communicably coupled to the processor circuitry 410, for example via the bus 416 or via one or more wired communications interfaces 430 (e.g., Universal Serial Bus or USB);

one or more wireless communications interfaces 420 (e.g., Bluetooth®, Near Field Communication or NFC); and/or one or more network interfaces 470 (IEEE 802.3 or Ethernet, IEEE 802.11, or WiFi®, etc.).

Processor-readable instruction sets 414 and other programs, applications, logic sets, and/or modules may be stored in whole or in part in the system memory 440. Such instruction sets 414 may be transferred, in whole or in part, from the one or more data storage devices 460. The instruction sets 414 may be loaded, stored, or otherwise retained in system memory 440, in whole or in part, during execution by the processor circuitry 410 and/or graphics processor circuitry 412. The processor-readable instruction sets 414 may include machine-readable and/or processor-readable code, instructions, or similar logic capable of providing the speech coaching functions and capabilities described herein.

The processor-based device 400 may include power management circuitry 450 that controls one or more operational aspects of the energy storage device 452. In embodiments, the energy storage device 452 may include one or more primary (i.e., non-rechargeable) or secondary (i.e., rechargeable) batteries or similar energy storage devices. In embodiments, the energy storage device 452 may include one or more supercapacitors or ultracapacitors. In embodiments, the power management circuitry 450 may alter, adjust, or control the flow of energy from an external power source 454 to the energy storage device 452 and/or to the processor-based device 400. The power source 454 may include, but is not limited to, a solar power system, a commercial electric grid, a portable generator, an external energy storage device, or any combination thereof.

For convenience, the processor circuitry 410, the graphics processor circuitry 412, the wireless I/O interface 420, the wired I/O interface 430, the power management circuitry 450, the storage device 460, and the network interface 470 are illustrated as communicatively coupled to each other via the bus 416, thereby providing connectivity between the above-described components. In alternative embodiments, the above-described components may be communicatively coupled in a different manner than illustrated in FIG. 4. For example, one or more of the above-described components may be directly coupled to other components, or may be coupled to each other, via one or more intermediary components (not shown). In another example, one or more of the above-described components may be integrated into the processor circuitry 410 and/or the graphics processor circuitry 412. In some embodiments, all or a portion of the bus 416 may be omitted and the components are coupled directly to each other using suitable wired or wireless connections.

Figure 6:
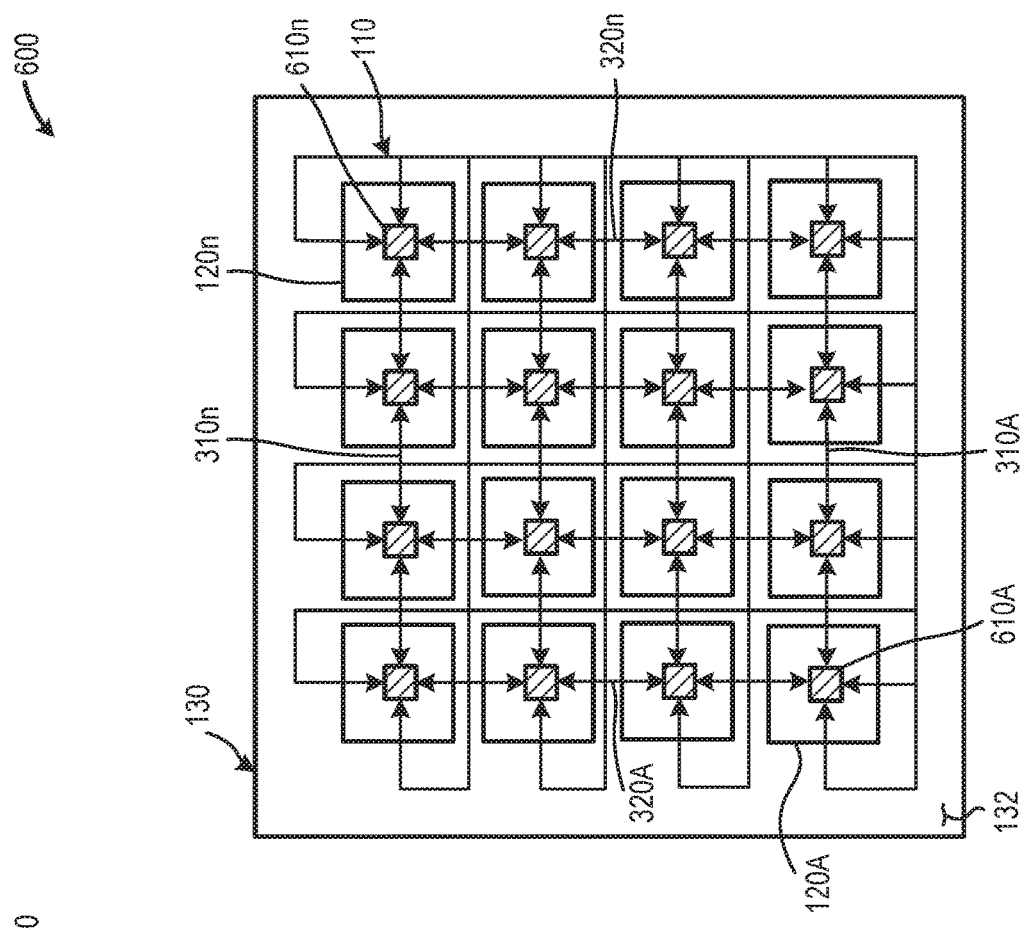
FIG. 6 is a plan view of an illustrative semiconductor package and die architecture that includes an electrical mesh network in a "toroidal" network configuration in which each of conductors included in the first plurality of conductors 31 and each of the conductors included in the second plurality of conductors "loop" between a portion of the IP cores, in accordance with at least one embodiment described herein.
Figure 5:
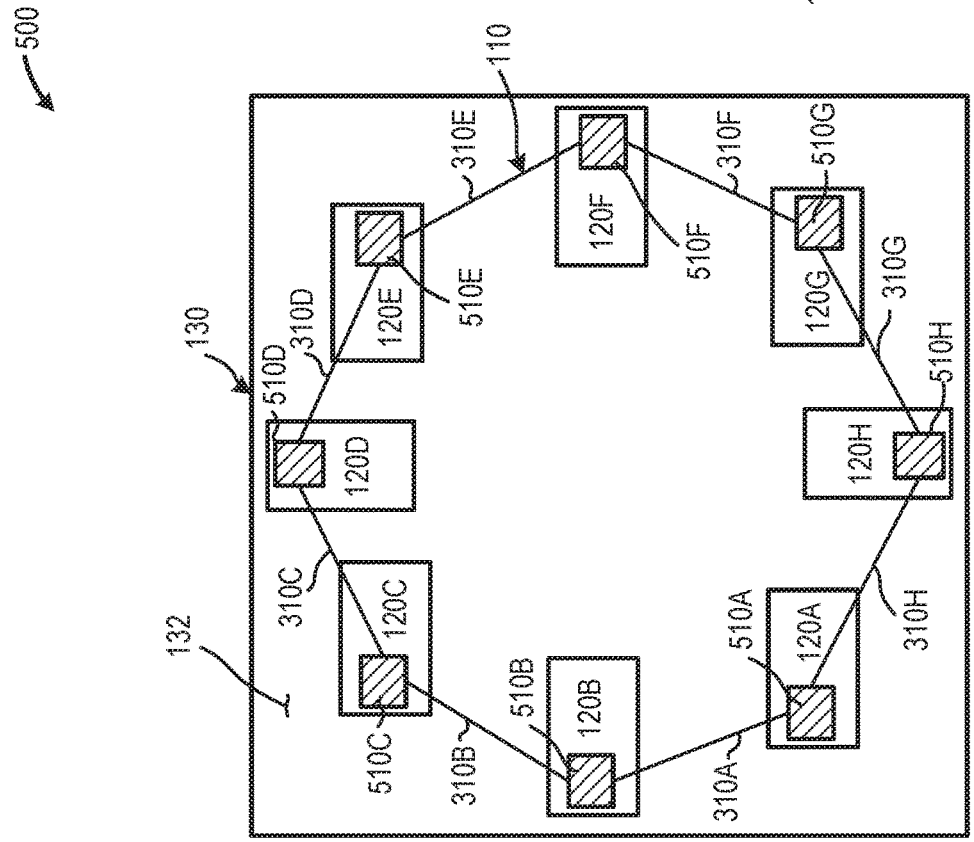
FIG. 5 is a plan view of an illustrative semiconductor package and die architecture that includes an electrical mesh network in a "ring" configuration in which the first plurality of conductors is arranged such that the individual conductors are positioned end-to-end to form a closed loop, in accordance with at least one embodiment described herein.
Figure 7:
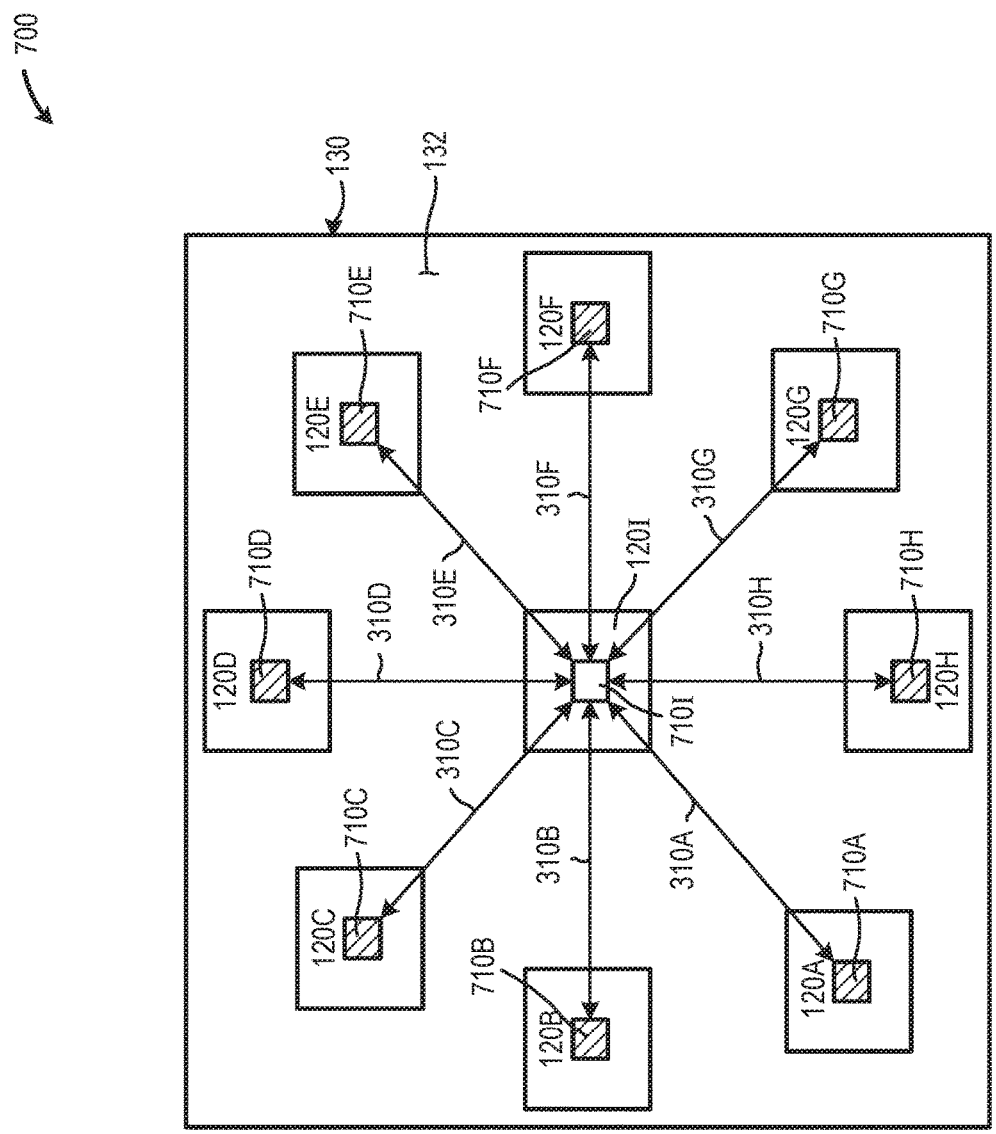
FIG. 7 is a plan view of an illustrative semiconductor package and die architecture that includes an electrical mesh network in a "star" network configuration in which each of conductors included in the first plurality of conductors conductively couple each of the peripheral IP cores to a central IP core, in accordance with at least one embodiment described herein.

FIGS. 5, 6, and 7 are plan views of various illustrative, non-limiting, electrical mesh network 110 configurations. One of the benefits of the electrical mesh network 110 described herein is the capability to tailor the configuration of the electrical mesh network 110 to suit particular geometry, manufacturing, and/or operational needs. In addition to changing or altering the physical geometry of the electrical mesh network 110, the number of conductors 310A-310n, 320A-320n included in each of the plurality of conductors 310, 320 may be varied or, as will be seen, one of the plurality of conductors may even be eliminated. The physical size, shape, and/or cross-sectional geometry of some or all of the conductors 310A-310n, 320A-320n included in the plurality of conductors 310, 320 may be the same or differ. In embodiments, the composition and/or physical geometry of conductors 310A-310n, 320A-320n included in each of the plurality of conductors 310, 320 may be altered to provide a desired conductance, resistance, capacitance, etc. Such physical, geometric, and compositional variations in the conductors 310A-310n, 320A-320n and/or conductors forming all or a portion of the electrical mesh network 110 should be considered as falling within the scope of this disclosure.

FIG. 5 is a plan view of an illustrative semiconductor package 500 that includes an electrical mesh network 110 in a "ring" configuration in which the first plurality of conductors 310 is arranged such that the individual conductors 310A-310n are positioned end-to-end to form a closed loop, in accordance with at least one embodiment described herein. In such an arrangement, the juncture between two adjoining conductors 310A-310n forms a node 510A-510n of the electrical mesh network 110. As depicted in FIG. 5, the IP cores 120 may be arranged in a generally circular or elliptical pattern on the upper surface 132 of the base die 130. Each of the IP cores 120A-120n may be conductively coupled, via one or more conductive structures 250, to a respective one of the plurality of nodes 510A-510n on the electrical mesh network 110.

FIG. 6 is a plan view of an illustrative semiconductor package 600 that includes an electrical mesh network 110 in a "toroidal" network configuration in which each of conductors 310A-310n included in the first plurality of conductors 310 and each of the conductors 320A-320n included in the second plurality of conductors 320 "loop" between a portion of the IP cores 120 disposed on the upper surface 132 of the base die 130, in accordance with at least one embodiment described herein. In the toroidal network configuration depicted in FIG. 6, each IP core 120 is conductively coupled to four neighboring IP cores 120. As depicted in FIG. 6, using a toroidal electrical mesh network 110, the IP cores 120 may be arranged in a generally orthogonal pattern on the upper surface 132 of the base die 130. Each of the IP cores 120A-120n may be conductively coupled, via one or more conductive structures 250, to a respective one of the plurality of nodes 610A-610n on the electrical mesh network 110.

FIG. 7 is a plan view of an illustrative semiconductor package 700 that includes an electrical mesh network 110 in a "star" network configuration in which each of conductors 310A-310n included in the first plurality of conductors 310 conductively couple each of the peripheral IP cores 120A-120H to a central IP core 120I, in accordance with at least one embodiment described herein. The distal (with respect to the central IP core 120I) termination point of each of the conductors 310A-310n defines a respective node 710A-710n on the electrical mesh network 110. In the star network configuration depicted in FIG. 7, each IP core 120 is conductively coupled to the central IP core 120I. As depicted in FIG. 7, using a star electrical mesh network 110, the IP cores 120 may be arranged in a generally circular or elliptical pattern about the periphery of the upper surface 132 of the base die 130. Each of the IP cores 120A-120n may be conductively coupled, via one or more conductive structures 250, to a respective one of the plurality of nodes 710A-710n on the electrical mesh network 110.

Figure 8:
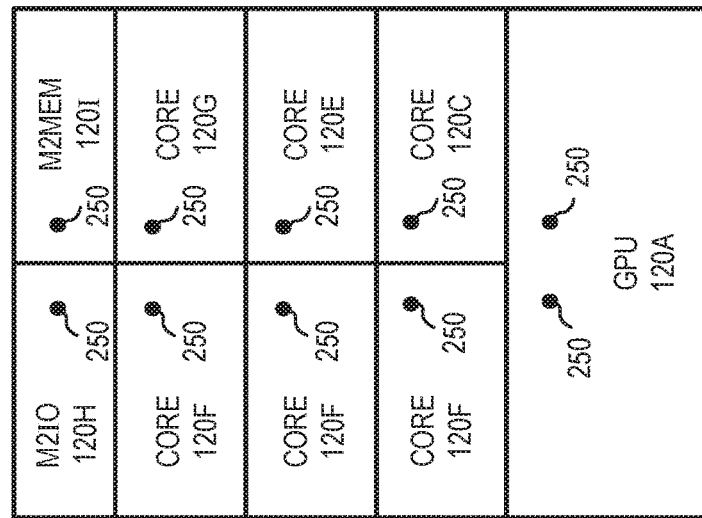
FIG. 8 is a plan view of a base die and an arrangement of IP cores to conductively couple to respective ones of each of a plurality of nodes included in the electrical mesh network disposed on the upper surface of the base die, in accordance with at least one embodiment described herein.
Figure 8:
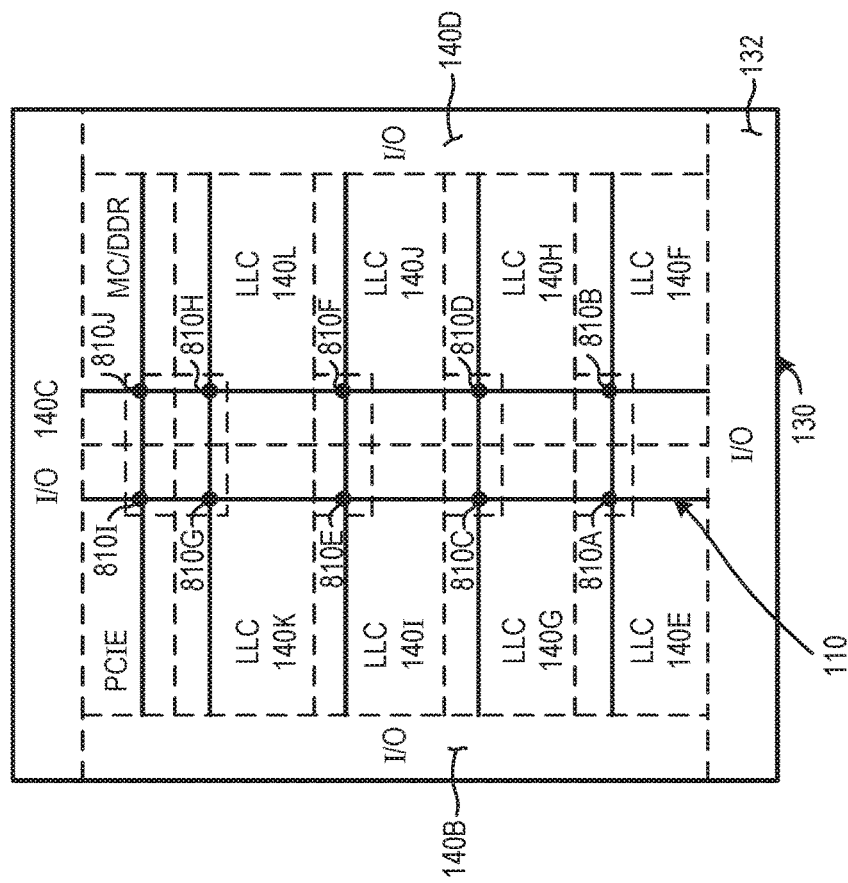

FIG. 8 is a plan view of a base die 130 and an arrangement of IP cores 120A-120I to conductively couple to respective ones of each of a plurality of nodes 810A-810J included in the electrical mesh network 110 disposed on the upper surface 132 of the base die 130, in accordance with at least one embodiment described herein. In the example embodiment depicted in FIG. 8, the base die includes support circuitry 140A-140N. Support circuitry 140A-140D includes input/output circuitry. Support circuitry 140E-140L includes low-level cache ("LLC") circuitry. Support circuitry 140M includes peripheral component interconnect express ("PCIe") circuitry. Support circuitry 140N include dual data rate (MC/DDR) circuitry. The IP cores 120A-120I include graphics processor circuitry 120A, processor core circuitry 120B-120G, memory to input/output (M2IO) circuitry, and performance monitoring counter (M2MEM) circuitry 120I.

As depicted in FIG. 8, the conductive structures 250 on each of the IP cores 120 aligns with a respective node 810 on the electrical mesh network 110. The area of the base die 130 occupied by the IP cores 120 is dedicated principally to last level cache memory circuitry, thus, the separation of the IP cores 120 from the support circuitry 140 carried by the base die 130 and the configuration of the electrical mesh network 110 beneficially does not increase the area occupied by the base die 130.

Figure 9:
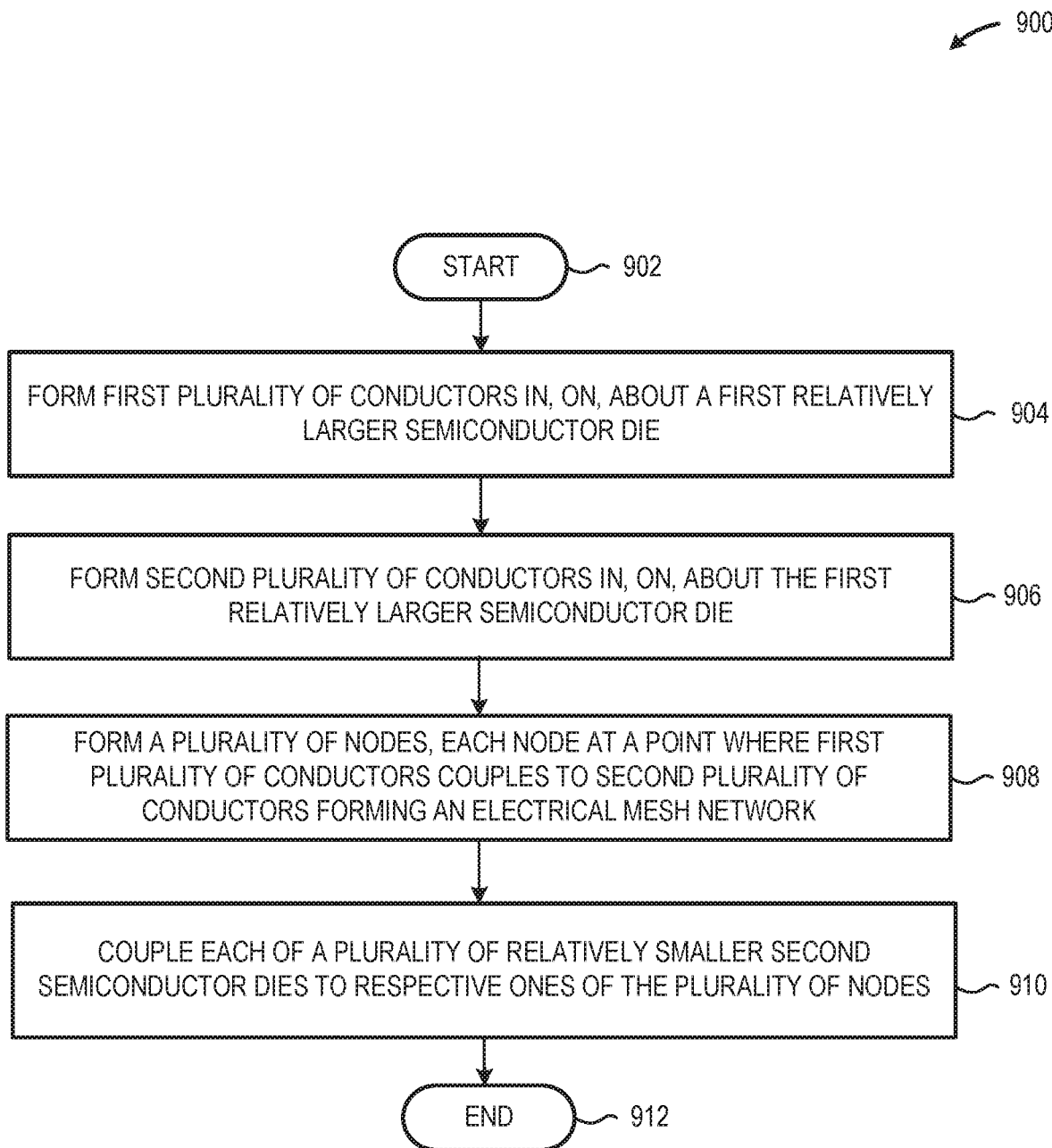
FIG. 9 is a high-level logic flow diagram depicting an illustrative method for conductively coupling a plurality of IP cores to a base die using an electrical mesh network disposed proximate an upper surface of the base die, in accordance with at least one embodiment described herein.

FIG. 9 is a high-level logic flow diagram depicting an illustrative method 900 for conductively coupling a plurality of IP cores 120 to a base die 130 using an electrical mesh network 110 disposed proximate an upper surface 132 of the base die 130, in accordance with at least one embodiment described herein. The method 900 may be used in conjunction with any of the methods 1000, 1100, and 1200 described in detail with regard to FIGS. 10, 11, and 12, respectively. Coupling the IP cores 120 to the base die 130 using an electrical mesh network 110 beneficially minimizes the physical separation between the IP cores 120 and support circuitry 140. Minimizing the distance between the IP cores 120 and the support circuitry 140 beneficially improves performance while reducing power consumption. Reducing component count on the IP cores 120 beneficially improves productivity by reducing the likelihood of component failure. The ability to couple evolving IP core technology to a base die 130 having an interface defined by the electrical mesh network 110 improves time-to-market, responsiveness, and productivity since time is not lost redesigning the base die for each improvement in IP core technology. The method 900 commences at 902.

At 904, a conductors 310A-310n included in a first plurality of conductors 310 are patterned, formed, deposited, or otherwise disposed in, on, about, or across all or a portion of a base die 130. In embodiments, the base die 130 may include a semiconductor die that is relatively larger when compared physically to the relatively smaller dies containing the IP core circuitry. The conductors 310A-310n may be patterned, formed, deposited, or otherwise disposed in, on, about, or across all or a portion of a base die 130 using any currently available and/or future developed material deposition process or method. For example, the conductors 310A-310n may be formed or otherwise deposited using a photolithographic process, an electrodeposition process, a vapor deposition process, an atomic layer deposition process, a printing process, a three-dimensional printing process, or combinations thereof.

In embodiments, at least a portion of the first plurality of conductors may be formed on the upper surface 132 of the base die 130. In embodiments, at least a portion of the first plurality of conductors 310 may be formed on one or more intermediate layers within the base die 130. The conductors 310A-310n may be formed using any conductive material including, but not limited to, metals (copper, aluminum, etc.), metal alloys (copper containing alloys, aluminum containing alloys, etc.), conductive non-metals (polymers, conductive nanoparticle matrices, etc.) or any combination thereof. The conductors 310A-310n may have any physical size, shape, geometry, and/or cross-sectional profile. The conductors 310A-310n may be disposed or otherwise deposited in any uniform or non-uniform pattern including, but not limited to, straight lines, circles, arcs, polygons, or combinations thereof. The conductors 310A-310n may be conductively coupled to support circuitry 140 formed in, on, about, or across the base die 130 using vias, metal traces, or similar electrically conductive structures. The conductors 310A-310n may be conductively coupled to contact pads or similar electrically conductive features on the lower surface 134 of the base die 130 by one or more through silicon vias (TSVs).

At 906, a conductors 320A-320n included in a first plurality of conductors 320 are patterned, formed, deposited, or otherwise disposed in, on, about, or across all or a portion of a base die 130. The conductors 320A-320n may be patterned, formed, deposited, or otherwise disposed in, on, about, or across all or a portion of a base die 130 using any currently available and/or future developed material deposition process or method. For example, the conductors 320A-320n may be formed or otherwise deposited using a photolithographic process, an electrodeposition process, a vapor deposition process, an atomic layer deposition process, a printing process, a three-dimensional printing process, or combinations thereof.

In embodiments, at least a portion of the second plurality of conductors 320 may be formed on the upper surface 132 of the base die 130. In embodiments, at least a portion of the second plurality of conductors 320 may be formed on one or more intermediate layers within the base die 130. In embodiments, at least a portion of the second plurality of conductors 320 may be disposed, patterned, formed, or otherwise deposited on the same layers of the base die 130 as the first plurality of conductors 310. In embodiments, at least a portion of the second plurality of conductors 320 may be disposed, patterned, formed, or otherwise deposited on different layers of the base die 130 than the first plurality of conductors 310. In such embodiments, vias, traces, or similar electrically conductive elements may conductively couple one or more conductors 320A-320n to one or more conductors 310A-310n.

In embodiments. at least one of the conductors 320A-320n included in the second plurality of conductors 320 intersects or is conductively coupled to at least one of the conductors 310A-310n included in the first plurality of conductors 310. In other embodiments, each of the conductors 320A-320n included in the second plurality of conductors 320 intersects or is conductively coupled to each of the conductors 310A-310n included in the first plurality of conductors 310. The conductors 320A-320n included in the second plurality of conductors 320 may intersect the conductors 310A-310n included in the first plurality of conductors 310 at any angle measured with respect to at least one of the conductors 310A-310n. In embodiments the conductors 320A-320n included in the second plurality of conductors 320 may intersect the conductors 310A-310n included in the first plurality of conductors 310 at an angle of approximately 90 degrees (i.e., each of the conductors 320A-302n is orthogonal to each of the conductors 310A-310n).

The conductors 320A-320n may be formed using any conductive material including, but not limited to, metals (copper, aluminum, etc.), metal alloys (copper containing alloys, aluminum containing alloys, etc.), conductive non-metals (polymers, conductive nanoparticle matrices, etc.) or any combination thereof. The conductors 320A-320n may have any physical size, shape, geometry, and/or cross-sectional profile. The conductors 320A-320n may be disposed or otherwise deposited in any uniform or non-uniform pattern including, but not limited to, straight lines, circles, arcs, polygons, or combinations thereof. The conductors 320A-320n may be conductively coupled to support circuitry 140 formed in, on, about, or across the base die 130 using vias, metal traces, or similar electrically conductive structures. The conductors 320A-320n may be conductively coupled to contact pads or similar electrically conductive features on the lower surface 134 of the base die 130 by one or more through silicon vias (TSVs).

At 908 a node on the electrical mesh network 110 is created at each point where a conductor 320 and a conductor 310 intersect or conductively couple. In embodiments, a plurality of nodes may be created by a plurality of intersections and/or conductive couplings between conductors 320A-320n and conductors 310A-310n. Each of the nodes creates a potential connection point for at least one IP core 120. In embodiments, each node may have a single conductive coupling to the IP core 120 and/or the support circuitry 140 disposed in the base die 130. In other embodiments, each node on the electrical mesh network 110 may have a plurality of conductive couplings to the IP core 120 and/or the support circuitry 140 disposed in the base die 130. A node on the electrical mesh network 110 may therefore represent a conductive coupling that includes only a single connection or a conductive coupling that includes a plurality of connections.

At 910, each of a plurality of IP cores 120 are conductively and physically coupled to respective ones of a plurality of nodes included in the electrical mesh network 110. The method 900 concludes at 912.

Figure 10:
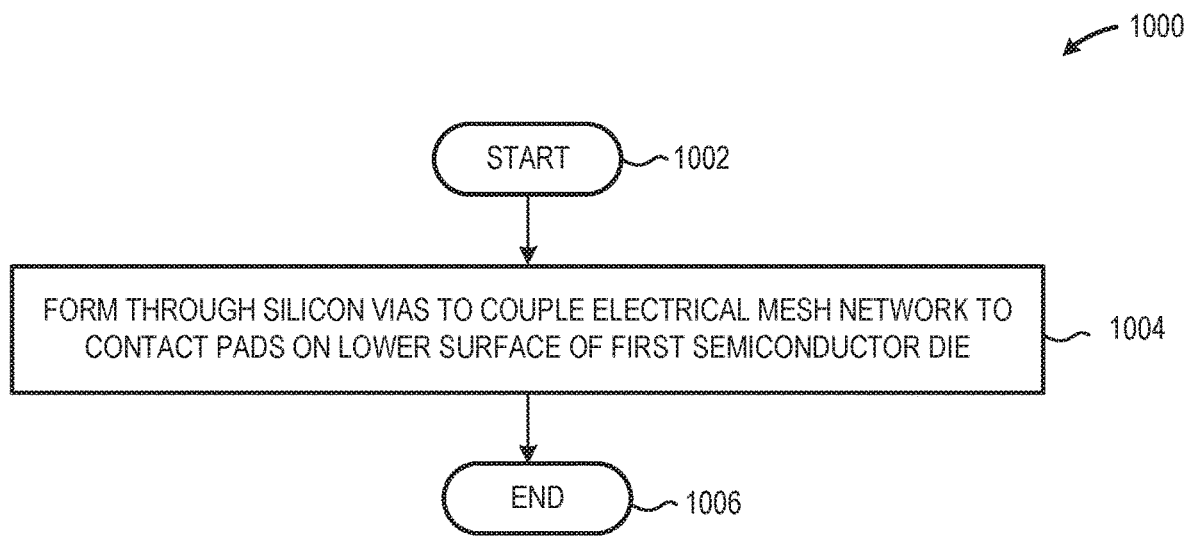
FIG. 10 is a high-level flow diagram of an illustrative method of coupling an electrical mesh network disposed on at least a portion of an upper surface of the base die to one or more conductive structures on the lower surface of the base die, in accordance with at least one embodiment described herein.

FIG. 10 is a high-level flow diagram of an illustrative method 1000 of coupling an electrical mesh network 110 disposed on at least a portion of an upper surface 132 of the base die 130 to one or more conductive structures 138 on the lower surface 134 of the base die 132, in accordance with at least one embodiment described herein. The method 1000 may be used in conjunction with any of the methods 900, 1100, and 1200 described in detail with regard to FIGS. 9, 11, and 12, respectively. The electrical mesh network 110 conductively couples to each of the IP cores 120 and also conductively couples to support circuitry 140 disposed in the base die 130. In embodiments, the electrical mesh network 110 may be conductively coupled to the substrate 150 via the conductive structures 138 disposed on the lower surface 134 of the base die 130. The method 1000 commences at 1002.

At 1004, through silicon vias (TSVs) 230 are formed through the base die 130. The TSVs 230 conductively couple the electrical mesh network 110 to the conductive structures 138 disposed on the lower surface 134 of the base die 130. In embodiments, one or more vias may additionally conductively couple some or all of the support circuitry 140 disposed in, on, or about the base die 130 to the conductive structures 138 disposed on the lower surface 134 of the base die 130. The method 1000 concludes at 1006.

Figure 11:
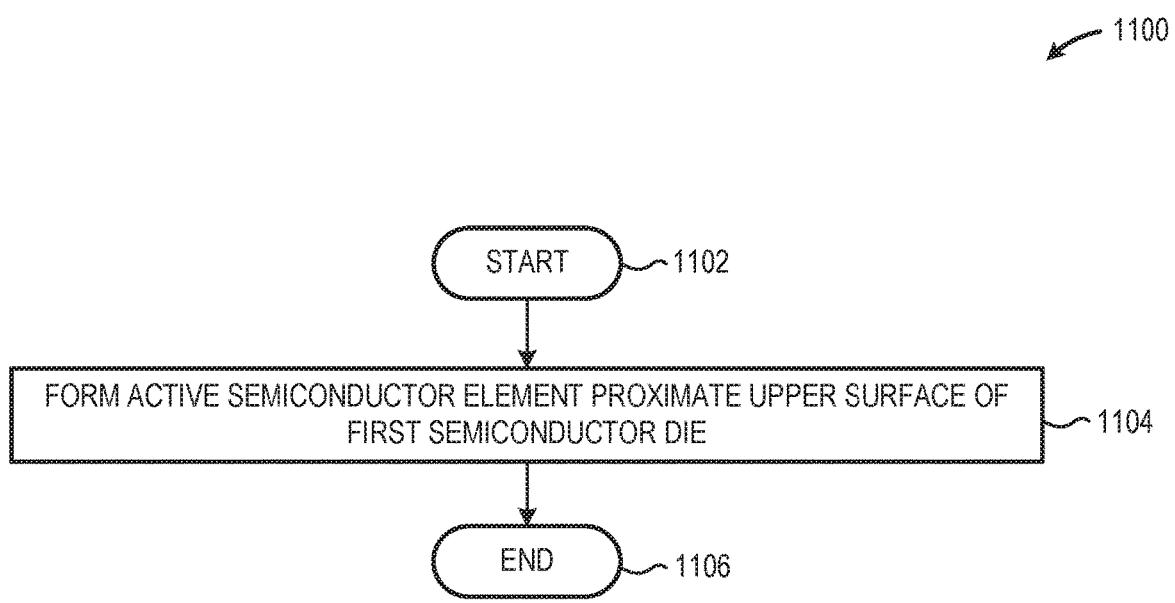
FIG. 11 is a high-level flow diagram of an illustrative method of forming one or more active components and/or support circuitry that includes one or more active components in a region or portion of the base die proximate the upper surface of the base die, in accordance with at least one embodiment described herein.

FIG. 11 is a high-level flow diagram of an illustrative method 1100 of forming one or more active components and/or support circuitry 140 that includes one or more active components in a region or portion of the base die 130 proximate the upper surface 132 of the base die 130, in accordance with at least one embodiment described herein. The method 1100 may be used in conjunction with any of the methods 900, 1000, and 1200 described in detail with regard to FIGS. 9, 10, and 12, respectively. In embodiments, the base die 130 may include support circuitry 140 accessed via the electrical mesh network 110 by the IP cores 120. In embodiments, the support circuitry 140 may include, but is not limited to: input/output circuitry; data storage circuitry; voltage regulation circuitry; power distribution circuitry; cache storage circuitry; and combinations thereof. In embodiments, the support circuitry 140 may include active components such as transistors. The method 1100 commences at 1102.

At 1104, active components are deposited, formed, or otherwise disposed in a portion 220 of the base die 130. In embodiments, the portion 220 may include a portion of the base die proximate the upper surface 132 of the base die. The active components may include one or more circuits containing active semiconductor components, such as transistors forming a portion of the support circuitry 140 conductively coupled to the electrical mesh network 110. The method 1100 concludes at 1106.

Figure 12:
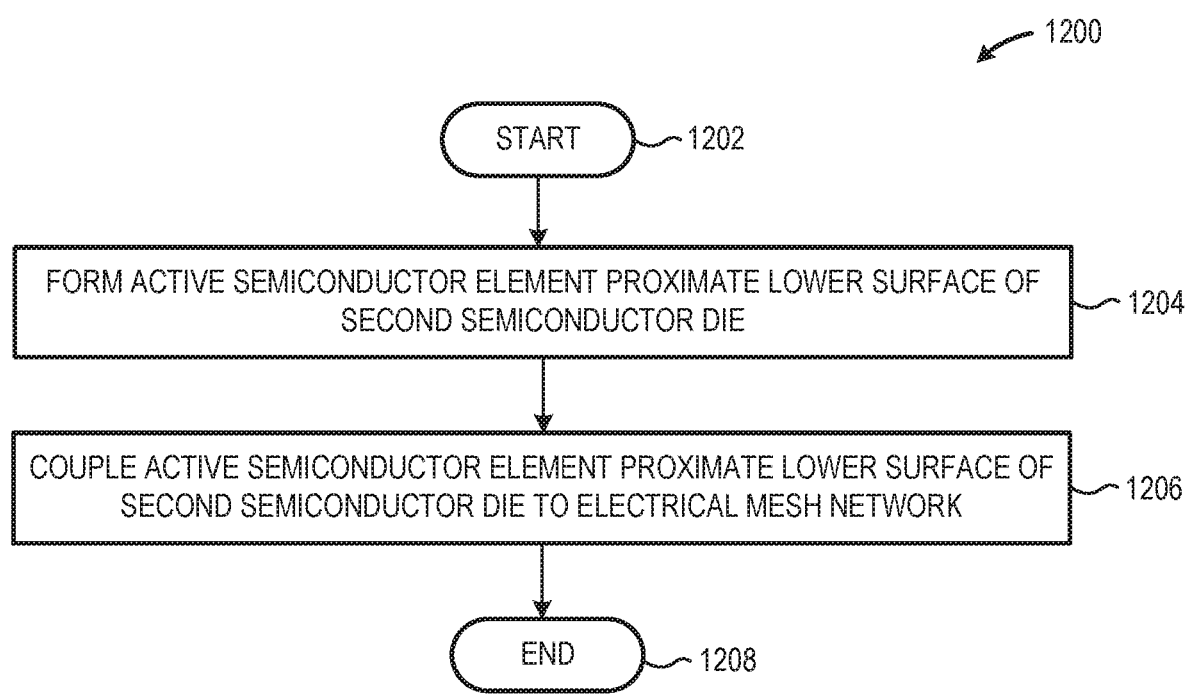
FIG. 12 is a high-level flow diagram of an illustrative method of forming one or more active components and/or circuitry that includes one or more active components in a region or portion of the IP core proximate the lower surface of the IP core, in accordance with at least one embodiment described herein.

FIG. 12 is a high-level flow diagram of an illustrative method 1200 of forming one or more active components and/or circuitry that includes one or more active components in a region or portion of the IP core 120 proximate the lower surface 124 of the IP core 120, in accordance with at least one embodiment described herein. The method 1200 may be used in conjunction with any of the methods 900, 1000, and 1100 described in detail with regard to FIGS. 9, 10, and 11, respectively. In embodiments, the IP core 120 may include circuitry such as processor core circuitry or graphics processor circuitry. Positioning active components proximate the lower surface 124 of the IP core beneficially shortens the physical distance between circuitry disposed in, on, or about the IP core 120 and support circuitry disposed in, on, or about the base die 130. Reducing the physical distance between the IP core circuitry and the support circuitry 140 may reduce power consumption and/or improve communication bandwidth. The method 1200 commences at 1202.

At 1204, active components are deposited, formed, or otherwise disposed in a portion 210 of the IP core 120. In embodiments, the portion 210 may include a portion of the IP core 120 that is proximate the lower surface 124 of the IP core 120. The active components may include one or more circuits containing active semiconductor components, such as transistors forming a portion of the functional circuitry of the IP core 120.

At 1206, the active components formed in the lower portion 210 of the IP core 120 are conductively coupled to the electrical mesh network 110. The method 1200 concludes at 1206.

While FIGS. 9, 10, 11, and 12 illustrate various operations according to one or more embodiments, it is to be understood that not all of the operations depicted in FIGS. 9, 10, 11, and 12 are necessary for other embodiments. Indeed, it is fully contemplated herein that in other embodiments of the present disclosure, the operations depicted in FIGS. 9, 10, 11, and 12, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eM-MCs), secure digital input/output (SDIO) cards, magnetic or optical cards, or any type of media suitable for storing electronic instructions. Other embodiments may be implemented as software executed by a programmable control device.

Thus, the present disclosure is directed to systems and methods of conductively coupling a plurality of relatively physically small IP core dies to a relatively physically larger base die using an electrical mesh network that is formed in whole or in part in, on, across, or about all or a portion of the base die. The use of the electrical mesh network beneficially permits the positioning of the IP cores in close proximity to support circuitry carried by the base die. The minimal separation between the IP core circuitry and the support circuitry advantageously improves communication bandwidth while reducing power consumption. Each of the IP cores may include functionally dedicated circuitry such as processor core circuitry or graphics processing circuitry. The use of IP core dies beneficially and advantageously permits the use of a wide variety of IP cores, each having a common or similar interface to the electrical mesh network.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for providing an electrical mesh network that communicably couples a plurality of relatively small, limited function, IP cores to a relatively large base die that includes support circuitry for use by the IP cores.

According to example 1, there is provided a semiconductor package. The semiconductor package may include: a base die having an upper surface and a lower surface, the base die including input/output circuitry; an electrical mesh network disposed proximate the upper surface of the base die and conductively coupled to the input/output circuitry included in the base die, the electrical mesh network including: a first plurality of conductors wherein; each of the first plurality of conductors disposed proximate the upper surface of the base die and spaced apart from the remaining first plurality of conductors; and a second plurality of conductors, wherein: each of the second plurality of conductors disposed proximate the upper surface of the base die and spaced apart from the remaining second plurality of conductors; and each of the second plurality of conductors intersects and conductively couples to at least one of the first plurality of conductors; a plurality of IP cores, each of the plurality of IP cores including processor core circuitry, each of the IP cores conductively coupled to a node formed by an intersection of one of the first plurality of conductors with one of the second plurality of conductors.

Example 2 may include elements of example 1 where each of the first plurality of conductors is disposed orthogonally to at least one of the second plurality of conductors.

Example 3 may include elements of any of examples 1 or 2 where each of the first plurality of conductors is disposed orthogonally to each of the second plurality of conductors.

Example 4 may include elements of any of examples 1 through 3 where each of the first plurality of conductors intersects and conductively couples to each of the second plurality of conductors.

Example 5 may include elements of any of examples 1 through 4 where the base die comprises a plurality of through-silicon-vias (TSV)s that conductively couple at least one of: the electrical mesh network and the I/O circuitry to contact pads disposed on the lower surface of the base die.

Example 6 may include elements of any of examples 1 through 5 where the base die further includes at least one active element.

Example 7 may include elements of any of examples 1 through 6 where the at least one active element comprises at least one transistor disposed proximate the upper surface of the base die, the at least one transistor conductively coupled to the electrical mesh network.

Example 8 may include elements of any of examples 1 through 7 where each of the IP cores includes an upper surface and a lower surface; and each of at least some of the IP cores includes at least one transistor disposed proximate the lower surface of the respective IP core.

Example 9 may include elements of any of examples 1 through 8 where each of the first plurality of conductors comprises a plurality of conductors patterned on the upper surface of the base die.

Example 10 may include elements of any of examples 1 through 9 where each of the second plurality of conductors comprises a plurality of conductors patterned on the upper surface of the base die.

Example 11 may include elements of any of examples 1 through 10 where the base die further comprises at least one of: voltage regulator circuitry, controller circuitry, and memory circuitry.

Example 12 may include elements of any of examples 1 through 11 where the base die further comprises voltage regulator circuitry, the voltage regulator circuitry conductively coupled to the processor core circuitry included in at least one of the plurality of IP cores.

According to example 13, there is provided a method. The method may include: forming a first plurality of conductors proximate an upper surface of a base die; forming a second plurality of conductors proximate the upper surface of the base die, wherein: each of the first plurality of conductors disposed proximate the upper surface of the base die and spaced apart from the remaining first plurality of conductors; each of the second plurality of conductors disposed proximate the upper surface of the base die and spaced apart from the remaining second plurality of conductors; and each of the first plurality of conductors intersects and conductively couples to at least one of the second plurality of conductors to form an electrical mesh network, the electrical mesh network conductively coupled to circuitry included in the base die; and conductively coupling each of a plurality of IP cores to a respective node formed by an intersection of one of the first plurality of conductors with one of the second plurality of conductors.

Example 14 may include elements of example 13 where forming a second plurality of conductors on the upper surface of the base die may further include: forming the second plurality of conductors on the upper surface of the base die such that each of the second plurality of conductors are disposed orthogonally to at least one of the first plurality of conductors.

Example 15 may include elements of examples 13 and 14 where forming a second plurality of conductors on the upper surface of the base die further comprises: forming the second plurality of conductors on the upper surface of the base die such that each of the second plurality of conductors are disposed orthogonally to each of the first plurality of conductors.

Example 16 may include elements of any of examples 13 through 15 where forming a second plurality of conductors on the upper surface of the base die further comprises: forming the second plurality of conductors on the upper surface of the base die such that each of the second plurality of conductors intersects and conductively couples to each of the first plurality of conductors.

Example 17 may include elements of any of examples 13 through 16, the method further comprising: forming, in the base die, a plurality of through-silicon-vias (TSV)s that conductively couple at least one of: the electrical mesh network and the I/O circuitry to contact pads disposed on the lower surface of the base die.

Example 18 may include elements of any of examples 13 through 17, the method further comprising: forming at least one active element proximate the upper surface of the base die.

Example 19 may include elements of any of examples 13 through 18 where forming at least one active element proximate the upper surface of the base die further comprises: forming at least one transistor proximate the upper surface of the base die.

Example 20 may include elements of any of examples 13 through 19, the method may further include: conductively coupling the at least one transistor to the electrical mesh network.

Example 21 may include elements of any of examples 13 through 20, the method may further include: forming at least one transistor proximate a lower surface of at least some of the plurality of IP cores; and conductively coupling each of the at least one transistors proximate the lower surface of at least some of the plurality of IP cores to the electrical mesh network.

Example 22 may include elements of any of examples 13 through 21 where forming a first plurality of conductors on an upper surface of a base die may further include: patterning each of the first plurality of conductors on the upper surface of the base die.

Example 23 may include elements of any of examples 13 through 22 where forming a second plurality of conductors on an upper surface of a base die may further include: patterning each of the second plurality of conductors on the upper surface of the base die.

Example 24 may include elements of any of examples 13 through 23, the method may further include: forming at least one of: input/output (I/O) circuitry, voltage regulator circuitry, controller circuitry, and memory circuitry in the base die.

Example 25 may include elements of any of examples 13 through 24, the method may further include: forming input/output circuitry in the base die; and conductively coupling, via the electrical mesh network, the I/O circuitry in the base die to the processor core circuitry included in at least one of the plurality of IP cores.

According to example 26, there is provided an electronic device. The electronic device may include: a printed circuit board; and a semiconductor package conductively coupled to the printed circuit board, the semiconductor package including: a base die having an upper surface and a lower surface, the base die including input/output circuitry; an electrical mesh network disposed proximate the upper surface of the base die and conductively coupled to the circuitry included in the base die, the electrical mesh network including: a first plurality of conductors wherein; each of the first plurality of conductors disposed proximate the upper surface of the base die and spaced apart from the remaining first plurality of conductors; and a second plurality of conductors, wherein: each of the second plurality of conductors disposed proximate the upper surface of the base die and spaced apart from the remaining second plurality of conductors; and each of the second plurality of conductors intersects and conductively couples to at least one of the first plurality of conductors; a plurality of IP cores, each of the plurality of IP cores including processor core circuitry, each of the IP cores conductively coupled to a node formed by an intersection of one of the first plurality of conductors with one of the second plurality of conductors.

Example 27 may include elements of example 26 where each of the first plurality of conductors is disposed orthogonally to at least one of the second plurality of conductors.

Example 28 may include elements of any of examples 26 and 27 where each of the first plurality of conductors is disposed orthogonally to each of the second plurality of conductors.

Example 29 may include elements of any of examples 26 through 28 where each of the first plurality of conductors intersects and conductively couples to each of the second plurality of conductors.

Example 30 may include elements of any of examples 26 through 29 where the base die further comprises a plurality of through-silicon-vias (TSV)s to conductively couple at least one of: the electrical mesh network and the I/O circuitry to contact pads disposed on the lower surface of the base die.

Example 31 may include elements of any of examples 26 through 30 where the base die further comprises at least one active element.

Example 32 may include elements of any of examples 36 through 31 where the at least one active element comprises at least one transistor disposed proximate the upper surface of the base die, the at least one transistor conductively coupled to the electrical mesh network.

Example 33 may include elements of any of examples 26 through 32 where each of the IP cores includes an upper surface and a lower surface; and where each of at least some of the IP cores includes at least one transistor disposed proximate the lower surface of the respective second semiconductor die.

Example 34 may include elements of any of examples 26 through 33 where each of the first plurality of conductors comprises a plurality of conductors patterned on the upper surface of the base die.

Example 35 may include elements of any of examples 26 through 34 where each of the second plurality of conductors comprises a plurality of conductors patterned on the upper surface of the base die.

Example 36 may include elements of any of examples 26 through 35 where the circuitry included in the base die further comprises at least one of: voltage regulator circuitry, controller circuitry, and memory circuitry.

Example 37 may include elements of any of examples 26 through 36 where the base die further comprises voltage regulator circuitry, the voltage regulator circuitry conductively coupled to the processor core circuitry included in at least one of the plurality of IP cores.

According to example 38, there is provided a system that includes: means for forming a first plurality of conductors proximate an upper surface of a base die; means for forming a second plurality of conductors proximate the upper surface of the base die, where: each of the first plurality of conductors disposed proximate the upper surface of the base die and spaced apart from the remaining first plurality of conductors; each of the second plurality of conductors disposed proximate the upper surface of the base die and spaced apart from the remaining second plurality of conductors; and each of the first plurality of conductors intersects and conductively couples to at least one of the second plurality of conductors to form an electrical mesh network, the electrical mesh network conductively coupled to at least the I/O circuitry included in the base die; means for conductively coupling each of a plurality of IP cores to a node formed by an intersection of one of the first plurality of conductors with one of the second plurality of conductors.

Example 39 may include elements of example 38 where the means for forming a second plurality of conductors proximate the upper surface of the base die may further include: means for forming the second plurality of conductors proximate the upper surface of the base die such that each of the second plurality of conductors are disposed orthogonally to at least one of the first plurality of conductors.

Example 40 may include elements of any of examples 38 and 39 where the means for forming a second plurality of conductors proximate the upper surface of the base die may further include: means for forming the second plurality of conductors proximate the upper surface of the base die such that each of the second plurality of conductors are disposed orthogonally to each of the first plurality of conductors.

Example 41 may include elements of any of examples 38 through 40 where forming a second plurality of conductors proximate the upper surface of the base die may further include: forming the second plurality of conductors on the upper surface of the base die such that each of the second plurality of conductors intersects and conductively couples to each of the first plurality of conductors.

Example 42 may include elements of any of examples 38 through 41 and the system may further include: means for forming, in the base die, a plurality of through-silicon-vias (TSV)s that conductively couple at least one of: the electrical mesh network and the I/O circuitry to contact pads disposed on the lower surface of the base die.

Example 43 may include elements of any of examples 38 through 42 and the system may further include: means for forming at least one active element proximate the upper surface of the base die.

Example 44 may include elements of any of examples 38 through 43 where the means for forming at least one active element proximate the upper surface of the base die may further include: means for forming at least one transistor proximate the upper surface of the base die.

Example 45 may include elements of any of examples 38 through 44 and the system may further include: means for conductively coupling the at least one transistor to the electrical mesh network.

Example 46 may include elements of any of examples 38 through 45 and the system may further include: means for forming at least one transistor proximate a lower surface of at least some of the plurality of IP cores; and means for conductively coupling each of the at least one transistors proximate the lower surface of at least some of the plurality of IP cores to the electrical mesh network.

Example 47 may include elements of any of examples 38 through 46 where the means for forming a first plurality of conductors proximate an upper surface of a base die may further include: means for patterning each of the first plurality of conductors on the upper surface of the base die.

Example 48 may include elements of any of examples 38 through 47 where the means for forming a second plurality of conductors on an upper surface of a base die may further include: means for patterning each of the second plurality of conductors on the upper surface of the base die.

Example 49 may include elements of any of examples 38 through 48 and the system may further include means for forming at least one of: input/output (I/O) circuitry, voltage regulator circuitry, controller circuitry, and memory circuitry in the base die.

Example 50 may include elements of any of examples 38 through 49 and the system may further include means for forming input/output circuitry in the base die; and means for conductively coupling, via the electrical mesh network, the I/O circuitry in the base die to the processor core circuitry included in at least one of the plurality of IP cores.

According to example 51, there is provided a semiconductor package. The semiconductor package and multiple dies may include: an electrical mesh network that includes: a first plurality of conductors; a second plurality of conductors, each of the second plurality of conductor intersecting at least one of the first plurality of conductors, forming a plurality of network nodes, each of the network nodes at an intersection of one of the first plurality of conductors with one of the second plurality of conductors; a base die including I/O circuitry conductively coupled to at least one of the plurality of nodes; and a plurality of IP cores, each of the plurality of IP cores including processor core circuitry; each of the plurality of IP cores conductively coupled to a respective one of the plurality of nodes.

Example 52 may include elements of example 51 where the base die includes an upper surface and a transversely opposed lower surface and where the first plurality of conductors and the second plurality of conductors are disposed on the upper surface of the base die.

Example 53 may include elements of any of examples 51 and 52 where each of the first plurality of conductors is disposed orthogonally to at least one of the second plurality of conductors.

Example 54 may include elements of any of examples 51 through 53 where of the first plurality of conductors is disposed orthogonally to each of the second plurality of conductors.

Example 55 may include elements of any of examples 51 through 54 where each of the first plurality of conductors conductively couples to each of the second plurality of conductors.

Example 56 may include elements of any of examples 51 through 55 where the base die further includes a plurality of through-silicon-vias (TSV)s that conductively couple at least one of: the electrical mesh network and the I/O circuitry to contact pads disposed on the lower surface of the base die.

Example 57 may include elements of any of examples 51 through 56 where the base die further includes at least one active element.

Example 58 may include elements of any of examples 51 through 57 where wherein the at least one active element comprises at least one transistor disposed proximate the upper surface of the base die, the at least one transistor conductively coupled to the electrical mesh network.

Example 59 may include elements of any of examples 51 through 58 where each of the plurality of IP cores includes an upper surface and a transversely opposed lower surface; and where each of at least some of the IP cores includes at least one transistor disposed proximate the lower surface of the respective IP core.

Example 60 may include elements of any of examples 51 through 59 where each of the first plurality of conductors comprises a plurality of conductors patterned on the upper surface of the base die.

Example 61 may include elements of any of examples 51 through 60 where each of the second plurality of conductors comprises a plurality of conductors patterned on the upper surface of the base die.

Example 62 may include elements of any of examples 51 through 61 where the base die further comprises at least one of: voltage regulator circuitry, controller circuitry, and memory circuitry.

Example 63 may include elements of any of examples 51 through 62 where the circuitry included in the base die comprises voltage regulator circuitry, the voltage regulator circuitry conductively coupled to the processor core circuitry included in at least one of the plurality of IP cores.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A semiconductor package, comprising:
   a base die having an upper surface and a lower surface, the base die including input/output circuitry;
   an electrical mesh network disposed on the upper surface of the base die and conductively coupled to the circuitry included on the base die, the electrical mesh network including:
      a first plurality of conductors wherein;
         each of the first plurality of conductors disposed on the upper surface of the base die and spaced apart from the remaining first plurality of conductors; and
      a second plurality of conductors; wherein:
         each of the second plurality of conductors disposed on the upper surface of the base die and spaced apart from the remaining second plurality of conductors; and
         each of the second plurality of conductors intersects and conductively couples to at least one of the first plurality of conductors; and
   a plurality of cores, each of the plurality of cores including processor core circuitry, each of the plurality of cores conductively coupled to a respective one of a plurality of nodes, each of the plurality of nodes formed by an intersection of one or the first plurality of conductors with one of the second plurality of conductors;
   wherein the circuitry included in the base die includes voltage regulator circuitry that is conductively coupled to the processor core circuitry included in at least one of the plurality of cores.

2. The semiconductor package of claim 1:
   wherein each of the first plurality of conductors comprises a plurality of conductors patterned on the upper surface of the base die; and
   wherein each of the second plurality of conductors comprises a plurality of conductors patterned on the upper surface of the base die.

3. The semiconductor package of claim 1:
   wherein the base die includes an upper surface and a transversely opposed lower surface;
   wherein the first plurality of conductors and the second plurality of conductors are disposed on the upper surface of the base die.

4. The semiconductor package of claim 1 wherein each of the first plurality of conductors is disposed orthogonally to at least one of the second plurality of conductors.

5. The semiconductor package of claim 1 wherein each of the first plurality of conductors is disposed orthogonally to each of the second plurality of conductors.

6. The semiconductor package of claim 1 wherein each of the first plurality of conductors conductively couples to each of the second plurality of conductors.

7. The semiconductor package of claim 1 wherein the base die comprises a plurality of through-silicon-vias (TSV)s that conductively couple at least one of: the electrical mesh network and the I/O circuitry to contact pads disposed on the lower surface of the base die.

8. The semiconductor package of claim 1 wherein the base die further includes at least one active element.

9. The semiconductor package of claim 1 wherein the circuitry included in the base die comprises voltage regulator circuitry, the voltage regulator circuitry conductively coupled to the processor core circuitry included in at least one of the plurality of cores.

10. An electronic device comprising:
    a printed circuit board; and
    a semiconductor package conductively coupled to the printed circuit board, the semiconductor package including:
       a base die having an upper surface and a lower surface, the base die including input/output circuitry;
       an electrical mesh network disposed on the upper surface of the base die and conductively coupled to the circuitry included in the base die, the electrical mesh network including:
          a first plurality of conductors wherein;
             each of the first plurality of conductors disposed on the upper surface of the base die and spaced apart from the remaining first plurality of conductors; and
          a second plurality of conductors, wherein:
             each of the second plurality of conductors disposed on the upper surface of the base die and spaced apart from the remaining second plurality of conductors; and
             each of the second plurality of conductors intersects and conductively couples to at least one of the first plurality of conductors; and
       a plurality of cores, each of the plurality of cores including processor core circuitry, each of the cores conductively coupled to a node formed by an intersection of one of the first plurality of conductors with one of the second plurality of conductors;

wherein the circuitry included in the base die comprises voltage regulator circuitry that is conductively coupled to the processor core circuitry included in at least one of the plurality of cores.

* * * * *